United States Patent
Loder et al.

(10) Patent No.: US 11,703,535 B2
(45) Date of Patent: Jul. 18, 2023

(54) INSULATION AND FAULT MONITORING FOR ENHANCED FAULT DETECTION

(71) Applicant: Rolls-Royce Corporation, Indianapolis, IN (US)

(72) Inventors: David Loder, Indianapolis, IN (US); Sándor Hallai, Indianapolis, IN (US); Gábor Nagy, Indianapolis, IN (US); Máté Bérces, Indianapolis, IN (US); Péter Bence Németh, Indianapolis, IN (US)

(73) Assignee: ROLLS-ROYCE CORPORATION, Indianapolis, IN (US)

( * ) Notice: Subject to any disclaimer, the term of this patent is extended or adjusted under 35 U.S.C. 154(b) by 0 days.

(21) Appl. No.: 17/358,708

(22) Filed: Jun. 25, 2021

(65) Prior Publication Data

US 2022/0413034 A1 Dec. 29, 2022

(51) Int. Cl.
*G01R 31/12* (2020.01)
*G01R 27/02* (2006.01)

(52) U.S. Cl.
CPC ......... *G01R 31/1272* (2013.01); *G01R 27/02* (2013.01)

(58) Field of Classification Search
CPC ............................ G01R 31/1272; G01R 27/02
See application file for complete search history.

(56) References Cited

U.S. PATENT DOCUMENTS

| | | | | |
|---|---|---|---|---|
| 3,823,370 A | * | 7/1974 | Pendleton | G01R 27/025 324/515 |
| 7,863,910 B2 | * | 1/2011 | Ishii | G01R 31/52 324/704 |
| 2007/0013382 A1 | * | 1/2007 | Hinz | B60L 3/0053 429/9 |
| 2014/0049860 A1 | | 2/2014 | Arima et al. | |
| 2019/0128943 A1 | * | 5/2019 | Kawamura | H01M 10/48 |
| 2020/0319261 A1 | * | 10/2020 | Kawamura | G01R 31/52 |
| 2021/0257843 A1 | | 8/2021 | Mituta et al. | |

OTHER PUBLICATIONS

Bender—The Power in Electrical Safety; Isometer IR155-4203/IR155-4204; Insulation monitoring device (IMD) for unearthed DC drive systems (IT systems) in electric vehicles; Version V004; IR155-42xx-V004_D00289_01_D_XXEN/02.2018; Feb. 2018, 6 pgs.
U.S. Non-Final Office Action for U.S. Appl. No. 17/358,754 dated Dec. 1, 2022 (18 pages).

* cited by examiner

*Primary Examiner* — Natalie Huls
*Assistant Examiner* — Sharad Timilsina
(74) *Attorney, Agent, or Firm* — Crowell & Moring LLC

(57) ABSTRACT

A fault monitoring device may monitor and detect for faults corresponding to a high-side voltage rail, to low-side voltage rail, or internally within a voltage source connected to the high-side voltage rail and the low-side voltage rail. The fault monitoring device may determine sample voltage levels and/or sample resistance values to detect the faults. Also, in various embodiments, the fault monitoring device may perform one or more fault monitoring processes over multiple stages. The fault monitoring device may determine the sample voltage levels and/or the sample resistance values while switching a secondary resistance circuit in different states over the multiple stages.

20 Claims, 7 Drawing Sheets

INSULATION AND FAULT MONITORING FOR ENHANCED FAULT DETECTION

TECHNICAL FIELD

This disclosure relates to fault monitoring and, in particular, to fault monitoring in connection with high-side and low-side insulation resistances in a high voltage bus.

BACKGROUND

Healthy power systems have large insulation resistance (e.g. >1 MΩ) between a high voltage bus having positive and negative voltage rails and ground. A breakdown in the insulation resistance due to a fault can lead to a short circuit between the high voltage bus and ground, loss of the bus, and equipment damage. Power systems are often connected to insulation monitoring devices to detect faults in order to guard against such damage. Existing insulation monitoring devices collectively monitor the insulation resistance between both positive and negative rails to chassis, and monitor the insulation resistance only in its current state, not over time.

Initially, a fault to chassis may not cause a complete short circuit, but may develop into a full short circuit over time. Often times, such initial faults are internal to the power system loads or sources, rather than within the distribution system. Existing insulation monitoring devices may not detect these internal faults. Consequently, such internal faults are latent faults that go undetected, and it is not until a full short circuit develops and equipment damage occurs that the faults are detected. On the other hand, if an insulation monitoring device can detect such internal faults, short circuits and equipment damage could be avoided. As such, ways to improve insulation monitoring techniques that allow for early detection of internal faults are desirable, especially for safety critical applications.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

The present description describes apparatuses, devices, systems, and methods for insulation monitoring and fault detection for high voltage buses in power systems, such as power systems for vehicles, including aircraft. The insulation monitoring described herein may measure voltages levels on high-side and low-side voltage rails of the high voltage bus, and determine or calculate resistance values for high-side and low-side insulation resistances based on the measured voltages. Based on the resistance values, the insulation monitoring may detect whether a fault is present between the high-side voltage rail and ground and/or between the low-side voltage rail and ground, and/or whether such a fault is imminent. In addition or alternatively, the insulation monitoring may determine whether an internal fault (a fault between an internal location of a voltage source and ground) is present based on the measured voltages. Such insulation monitoring may allow for early detection before a fault causes equipment failure. Other insulating monitoring techniques that determine a collective resistance value for the high-side and low-side insulation resistances, rather than individual resistance values, may not be able to achieve or perform such fault detection. Additionally, the detection provided by the insulation monitoring described herein may assist with diagnostic and repair, which in turn may lead to faster repair time. Additionally, the detection provided by the insulation monitoring described herein may be used for predictive maintenance and insulation health prognostics, which in turn may lead to cost savings to an operator.

Figure 1:
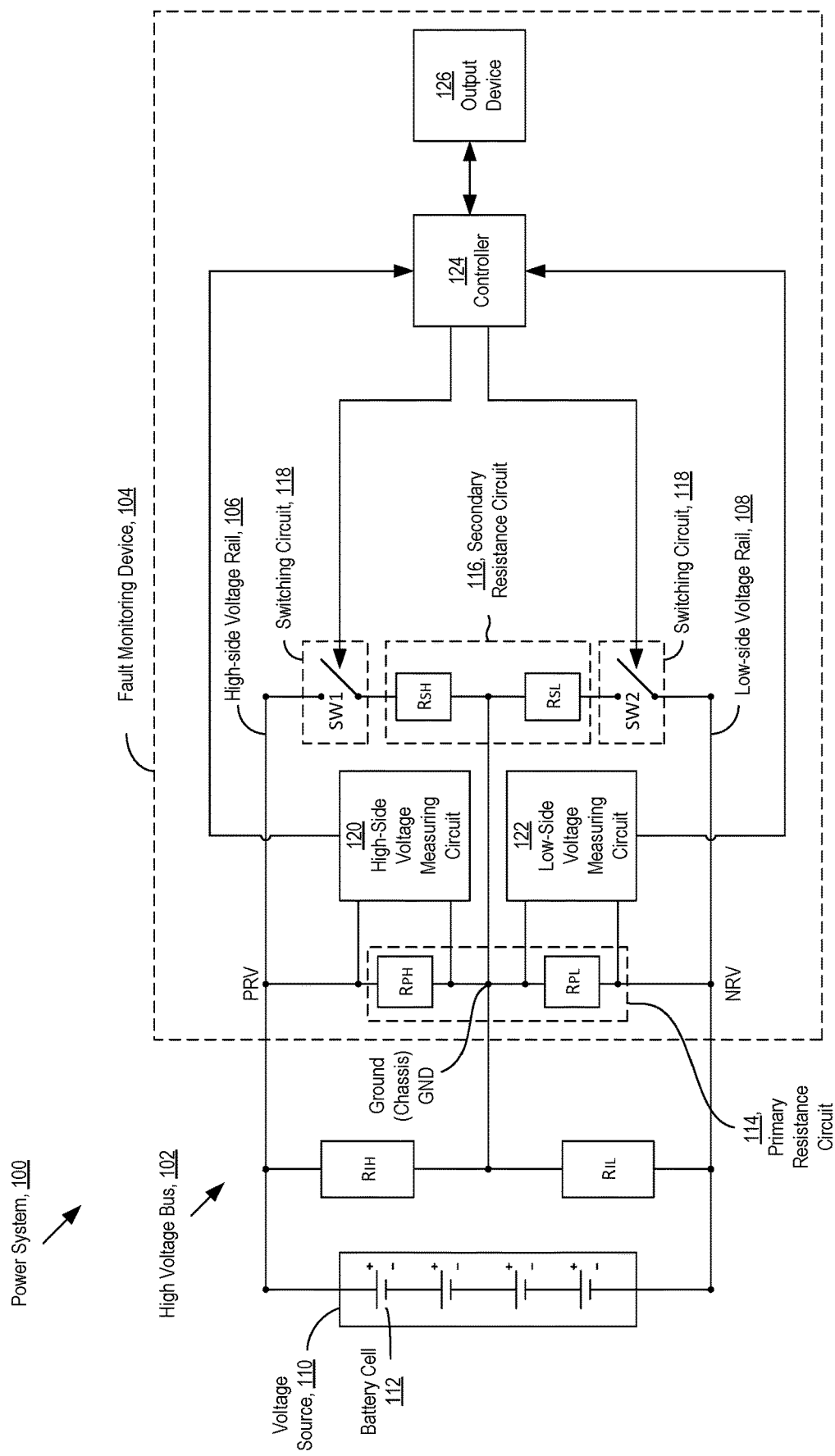
FIG. 1 shows a block diagram of a power system including a high voltage bus connected to an insulation monitoring device

In further detail, FIG. 1 shows a power system 100 (e.g., a direct current (DC) power system) that includes a high voltage bus 102 coupled to a fault monitoring device or circuit 104 (also referred to as an insulation monitoring device in various embodiments). In various embodiments, the power system 100 may implemented in a vehicle, such as an aircraft, an automobile, a train, or a water vessel, as non-limiting examples. In addition or alternatively, in various embodiments, the power system 100 may be an electric drive system (e.g., a hybrid electric drive system) for the overall system (e.g., the vehicle) in which it is implemented.

The high voltage bus 102 includes a high-side voltage rail 106 at which a positive rail voltage PRV is generated with reference to a ground reference GND, and a low-side voltage rail 108 at which a negative rail voltage NRV is generated with reference to the ground reference GND. In various embodiments, both the positive rail voltage PRV and the negative rail voltage NRV are "high voltages" in that they both have large voltage magnitudes, such as greater than 100 V. In one particular embodiment, the positive rail voltage PRV is +540 V and the negative rail voltage NRV is −540 V, although various other voltage values for the positive rail voltage PRV and the negative rail voltage NRV may be possible.

In addition, the power system 100 may include or at least be coupled to a voltage source 110 configured to generate the positive rail voltage PRV on the high-side voltage rail 106 and the negative rail voltage NRV on the low-side voltage rail 108. The voltage source 110 may be considered a component of the high voltage bus 102, or may be considered a component separate from the high voltage bus 102 to which the high voltage bus 102 is coupled. Also, in various embodiments, the voltage source 110 is a DC voltage source configured to generate the positive rail voltage PRV and the negative rail voltage NRV each as DC voltages. In addition or alternatively, the voltage source 110 may include of a battery pack, an electrical generator coupled with an AC/DC converter stage, a fuel cell, or any combination thereof. In addition, a DC/DC converter used to regulate the bus voltage may or may not be included in the power system 100. For at least some embodiments, such as shown in FIG. 1, the battery pack has a plurality of battery cells 112 connected in series with each other.

As shown in FIG. 1, the voltage source 110 has a first end connected to the high-side voltage rail 106 where the positive rail voltage PRV is generated, and a second end connected to the low-side voltage rail 108 where the negative rail voltage NRV is generated. Portions of the voltage source 110 other than the first and second ends may be internal portions of the voltage source 110. For example, where the voltage source 110 is a battery including a plurality of series-connected battery cells 112, an internal portion may be where two battery cells are connected to each other.

As described above, the high voltage bus 102 includes, or is coupled to, a ground GND. The voltage values of the positive rail voltage PRV and the negative rail voltage NRV, and other voltage values of any other voltage generated in the power system 100, may be with reference to the ground GND. In various embodiments, including those where the power system is implemented in a vehicle, the ground GND may be a chassis of the vehicle.

The voltage bus 102 may have a high-side insulation resistance $R_{IH}$ between the high-side voltage rail 106 and ground GND, and a low-side insulation resistance $R_{IL}$ between the low-side voltage rail 108 and ground GND. The high-side insulation resistance $R_{IH}$ provides electrical insulation between the high-side voltage rail 106 and ground GND. In addition, the low-side insulation resistance $R_{IL}$ provides electrical insulation between the low-side voltage rail 108 and ground GND. Also, for at least some embodiments, one or both of the high-side insulation resistance $R_{IH}$ and the low-side insulation resistance $R_{IL}$ provides electrical insulation between the voltage source 110, including one or more internal locations of the voltage source 110 (e.g., between two battery cells 112), and ground GND.

Optimally, each of the high-side and low-side insulation resistances $R_{IH}$, $R_{IL}$ are relatively high, such as on the order of 1 MO or greater, providing sufficient electrical insulation between the high-side voltage rail 106, the low-side voltage rail 108, and the voltage source 110. However, during operation, one or both of the high-side and low-side insulation resistances $R_{IH}$, $R_{IL}$ may partially or completely breakdown, lowering the amount of electrical insulation they provide between ground GND and high-side voltage rail 106, the low-side voltage rail 108, and/or the voltage source 110. Such a breakdown or lowering of one or both of the insulation resistances $R_{IH}$, $R_{IL}$ may create or produce a fault in the high voltage bus 102.

In general, a fault is an unintended and/or abnormal flow of electrical current from one point to another. In the high voltage bus 102, a fault caused by a breakdown in the high and/or low insulation is most likely to occur between ground GND and the high-side voltage rail 106, between ground GND and the low-side voltage rail 108, and/or between ground GND and an internal location within the voltage source 110, such as between two battery cells 112. For clarity, as used herein, the term "rail fault" and "internal fault" are used to distinguish between faults between ground GND and the high-side and low-side voltage rails 106, 108, and faults between ground GND and the voltage source 110 and/or internal locations of the voltage source 110. Specifically, the term "rail fault" refers to a fault between the high-side voltage rail 106 and ground GND or between the low-side voltage rail 108 and ground GND, and the term "internal fault" refers to a fault between the voltage source 110 and ground GND and/or between an internal point or location of the voltage source 110 (e.g., a connection point between two battery cells 112) and ground GND.

Not all faults are the same and some faults may be more critical or severe than others. A fault that is highly severe or critical may cause failure of the high voltage bus 102, damage to the power system 100 and/or the other components of the overall system (e.g., the vehicle), cause injury to people, and/or require immediate shutdown or attention by an operator. Highly severe or critical faults may be caused by a complete breakdown in one or both of the high-side and low-side insulation resistances $R_{IH}$, $R_{IL}$.

Other faults may be less than highly severe or critical. Such less-severe faults may be caused by a less than a complete breakdown in one or both of the high-side and low-side insulation resistances $R_{IH}$, $R_{IL}$, may not cause system failure or damage, and/or may not require immediate attention. Nonetheless, these less-severe faults can turn into highly severe faults if left unattended. As such, less-severe faults should be attended to in the near future (within a certain predetermined time period) to avoid these faults becoming highly severe faults that create system failure or damage. In this regard, less-severe faults may serve as a warning or a forecast that a highly severe fault is imminent if no further action is taken.

To further illustrate highly severe and less-severe faults, if a highly severe fault is detected while a vehicle is in motion and/or in route to a destination, an operator may attend to the highly severe fault relatively immediately, such as by shutting down and/or replacing one or more components before the vehicle reaches its destination. On the other hand, if a less-severe fault is detected while a vehicle is in motion and/or in route to a destination, an operator may attend to the less severe fault once the vehicle reaches its destination.

For clarity, the term "high-level fault" is used herein to refer to a highly severe fault identified as causing system failure or damage, and/or identified as requiring immediate attention. Additionally, the term "mid-level fault" is used herein to refer to a less-severe fault identified as not causing system failure or damage, and/or identified as requiring attention not immediately but in the near future (within a certain predetermined time period, such as within a certain number of hours or days or upon arrival at a destination, as non-limiting examples). The terms "high-level fault" and "mid-level fault" may be used alone, or may be used in combination with "rail" and "internal" to identify both the severity of a fault and the type of fault in the high voltage bus 102.

The fault monitoring device 104 is an electronic device that is configured to monitor for and detect faults, including rail faults and/or internal faults, in the high voltage bus 102. To do so, the fault monitoring device 104 may measure voltages corresponding to the high-side and low-side voltage rails 106, 108. In some embodiments, the fault monitoring device 104 may further determine or calculate resistance values for or corresponding to each of the high-side and low-side insulation resistances $R_{IH}$, $R_{IL}$, and/or for or corresponding to each of the high-side and low-side voltage rails 106, 108, based on the measured voltages, and monitor for a rail fault based on the calculated resistance values. In some of these embodiments, the fault monitoring device 104 may perform or execute a first fault monitoring process based on at least one of the calculated the high-side and/or low-side insulation resistance values to determine whether a high-level rail fault is present in the high voltage bus 102. In other of these embodiments, the fault monitoring device 104 may perform or execute a second fault monitoring process based on at least one of the calculated resistance values to determine whether a mid-level rail fault is present in the high voltage bus 102.

In still other of these embodiments, the fault monitoring device 104 may perform the first fault monitoring process and the second fault monitoring process either in sequence or in parallel. When performing the first and second fault monitoring processes in sequence, the fault monitoring device 104 may perform one of the first fault monitoring process or the second fault monitoring process as an initial fault monitoring process, and then may perform the other of the first and second fault monitoring processes as a subsequent fault monitoring process. In some embodiments, whether the fault monitoring device 104 performs the subsequent fault monitoring process may depend on a fault result of the initial fault monitoring process.

In other embodiments, the fault monitoring device 104 may perform a third fault monitoring process based on at least one of the measured voltages corresponding to the voltage rails 106, 108 to determine whether an internal fault is present. In some embodiments, the fault monitoring device 104 may perform the third fault monitoring process as a standalone fault detection process. In other embodiments, the fault monitoring device 104 may perform the third fault monitoring process in combination at least one of the first or second fault monitoring processes. In some of these embodiments, the fault monitoring device 104 may perform the third fault monitoring process, and determine whether to perform at least one of the first or second fault monitoring processes dependent on a fault result of the third fault monitoring process. For example, if the third fault monitoring process indicates that no internal fault is present, then the fault monitoring device 104 may perform at least one of the first or second fault monitoring processes to determine if a high-level and/or a mid-level rail fault is present. On the other hand, if the third fault monitoring process indicates that an internal fault is present, then the fault monitoring device 104 may not perform the first or second fault monitoring processes.

As described in further detail below, the fault monitoring device 104 may perform at least one of the fault monitoring processes over a plurality of stages. In each stage, the fault monitoring device 104 may measure at least two voltage levels corresponding to at least one of the high-side voltage rail 106 or the low-side voltage rail 108, and/or to at least one of the high-side insulation resistance $R_{IH}$ or the low-side insulation resistance $R_{IL}$. In addition, the fault monitoring device 104 may determine at least one fault result of the at least one fault monitoring process in at least one of the stages based on the at least one measured voltage level.

Additionally, the fault monitoring device 104 includes a variable resistance circuit that is configured to variably connect to the high voltage bus 102. In general, the variable resistance circuit includes a network or a plurality of resistance elements having a variable connection to the high voltage bus 102. By having a variable connection, the number of resistance elements and/or which of the resistance elements that connect to the high voltage bus 102 can change. In accordance with the variable connection, the variable resistance circuit can be configured in a plurality of different states. In each state, the variable resistance circuit has a certain configuration of the resistance elements connected to and disconnected from the high voltage bus 102. Different states have different configurations of the resistance elements connected to and disconnected from the high voltage bus 102.

As described in further detail below, the fault monitoring device 104 can control the states of the variable resistance circuit over the stages of the at least one fault monitoring process. In particular, the fault monitoring device 104 may configure the variable resistance circuit in different states over consecutive stages. In doing so, the fault monitoring device 104 has different configurations of resistance elements connected to and disconnected from the high voltage bus 102 over consecutive stages. As a result, the fault monitoring device 104 measures voltage levels corresponding to the high-side and low-side voltage rails 106, 108 over the stages, with the voltage levels being dependent on the different states of the resistance elements connected to and disconnected from the high-side and low-side voltage rails 106, 108 over these stages. The fault monitoring device 104 may then use the voltage levels to determine at least one fault result for the at least one fault monitoring process.

For at least some embodiments such as shown in FIG. 1, the variable resistance circuit includes a primary resistance circuit 114 and a secondary resistance circuit 116, each configured to connect to the high voltage bus 102. In the example embodiment shown in FIG. 1, resistance elements of the primary resistance circuit 114 include a high-side primary resistance $R_{PH}$ and a low-side primary resistance $R_{PL}$. The high-side and low-side primary resistances $R_{PH}$, $R_{PL}$ may each be any discrete electrical component or element having an associated electrical resistance.

Each of the high-side primary resistance $R_{PH}$ and the low-side primary resistance $R_{PL}$ are connected to the high voltage bus 102. By being connected to the high voltage bus 102, each of the high-side primary resistance $R_{PH}$ and the low-side primary resistance $R_{PL}$ is able to draw current based on a voltage generated at the high-side voltage rail 106 or the low-side voltage rail 108. In FIG. 1, the high-side primary resistance $R_{PH}$ is connected to the high voltage bus 102 via the high-side voltage rail 106. The high-side primary resistance $R_{PH}$ has a first end connected to the high-side voltage rail 106 and a second end connected to ground GND. Similarly, the low-side primary resistance $R_{PL}$ is connected to the high voltage bus 102 via the low-side voltage rail 108. The low-side primary resistance $R_{PL}$ has a first end connected to the low-side voltage rail 108 and a second end connected to ground GND.

For some example embodiments such as shown in FIG. 1, the primary resistance circuit 114 is fixedly or always connected to the high voltage bus 102. For other example embodiments, at least one of the high-side primary resistance $R_{PH}$ or the low-side primary resistance $R_{PL}$, is variably or selectively connected to the high voltage bus 102. By being variably selectively connected to the high voltage bus 102, each of the high-side primary resistance $R_{PH}$ and the low-side primary resistance $R_{PL}$ can be configured to be electrically connected to the high voltage bus 102 during some time periods of operation, and electrically disconnected to the high voltage bus 102 during other time periods of operation. As mentioned, a resistance that is electrically connected to the high voltage bus 102 is able to draw current based on a voltage generated on the high-side voltage rail 106 or the low-side voltage rail 108. Conversely, a resistance is electrically disconnected from the high voltage bus 102 if it is unable to draw current based on a voltage generated on the high-side voltage rail 106 or the low-side voltage rail 108.

For some example embodiments, the primary resistance circuit 114, including the high-side primary resistance $R_{PH}$ and/or the low-side primary resistance $R_{PL}$, is variably or selectively connected to the high voltage bus 102 via a set of one or more switches. As used herein, a switch is an electrical component that is configured to switch or alternate between two states, including an on or closed state, and an off or open state. In the on state, the switch electrically connects two components together by providing a path of low resistance between the two components. In particular embodiments, the low resistance is sufficiently low, such that the switch in the on state effectively functions as a short circuit. In the off state, the switch electrically disconnects two components by providing a path of high resistance between the two components. In particular embodiments, the high resistance is sufficiently high, such that the switch in the off state effectively functions as an open circuit.

For some embodiments where the high-side primary resistance $R_{PH}$ is selectively connected to the high voltage bus 102, a switch is electrically configured between the high-side primary resistance $R_{PH}$ and the high-side voltage rail 106, selectively connecting the first end of the high-side primary resistance $R_{PH}$ to the high-side voltage rail 106. In other embodiments, a switch is electrically configured between the high-side primary resistance $R_{PH}$ and ground GND, selectively connecting the second end of the high-side primary resistance $R_{PH}$ to ground GND. In still other embodiments, a first switch is electrically configured between the high-side primary resistance $R_{PH}$ and the high-side voltage rail 106, and a second switch is electrically configured between the high-side primary resistance $R_{PH}$ and ground GND. Various ways of selectively connecting the high-side primary resistance $R_{PH}$ to the high voltage bus 102 via the high-side voltage rail 106 using one or more switches may be possible.

Similarly, for some embodiments where the low-side primary resistance $R_{PL}$ is selectively connected to the high voltage bus 102, a switch is electrically configured between the low-side primary resistance $R_{PL}$ and the low-side voltage rail 108, selectively connecting the first end of the low-side primary resistance $R_{PL}$ to the low-side voltage rail 108. In other embodiments, a switch is electrically configured between the low-side primary resistance $R_{PL}$ and ground GND, selectively connecting the second end of the low-side primary resistance $R_{PL}$ to ground GND. In still other embodiments, a first switch is electrically configured between the low-side primary resistance $R_{PL}$ and the low-side voltage rail 108, and a second switch is electrically configured between the low-side primary resistance $R_{PL}$ and ground GND. Various ways of selectively connecting the low-side primary resistance $R_{PL}$ to the high voltage bus 102 via the low-side voltage rail 108 using one or more switches may be possible.

In addition, the secondary resistance circuit 116 of the variable resistance circuit is configured to selectively connect to the high voltage bus 102. For at least some embodiments such as shown in FIG. 1, the variable resistance circuit is configured to change its variable connection to the high voltage bus 102 through the secondary resistance circuit 116. In the example embodiment shown in FIG. 1, the resistance elements of the secondary resistance circuit 116 include a high-side secondary resistance $R_{SH}$ and a low-side secondary resistance $R_{SL}$. The high and low-side secondary resistances $R_{SH}$, $R_{SL}$ may each be any discrete electrical component having an associated electrical resistance. By being selectively connected to the high voltage bus 102, each of the high-side secondary resistance $R_{SH}$ and the low-side secondary resistance $R_{SL}$ are configured to be electrically connected to the high voltage bus 102 during some time periods of operation, and electrically disconnected from the high voltage bus 102 during other time periods of operation.

The high-side secondary resistance $R_{SH}$ is electrically connected to the high voltage bus 102 when it is able to draw current based on a voltage generated on the high-side voltage rail 106. For example, when the high-side secondary resistance $R_{SH}$ is electrically connected to the high voltage bus 102, the high-side secondary resistance $R_{SH}$ is able to draw current from the high-side voltage rail 106 to ground GND. Conversely, when the high-side secondary resistance $R_{SH}$ is electrically disconnected from the high voltage bus 102, the high-side secondary resistance $R_{SH}$ is unable to draw current based on a voltage generated on the high-side voltage rail 106. For example, when the high-side secondary resistance $R_{SH}$ is electrically disconnected from the high voltage bus 102, the high-side secondary resistance $R_{SH}$ is unable to draw current from the high-side voltage rail 106 to ground GND.

Similarly, the low-side secondary resistance $R_{SL}$ is electrically connected to the high voltage bus 102 when it is able to draw current based on a voltage generated on the low-side voltage rail 108. For example, when the low-side secondary resistance $R_{SL}$ is electrically connected to the high voltage bus 102, the low-side secondary resistance $R_{SL}$ is able to draw current from the low-side voltage rail 108 to ground GND. Conversely, when the low-side secondary resistance $R_{SL}$ is electrically disconnected from the high voltage bus 102, the low-side secondary resistance $R_{SL}$ is unable to draw current based on a voltage generated on the low-side voltage rail 108. For example, when the low-side secondary resistance $R_{SL}$ is electrically disconnected from the high voltage bus 102, the low-side secondary resistance $R_{SL}$ is unable to draw current from the low-side voltage rail 108 to ground GND.

For at least some embodiments such as shown in FIG. 1, the fault monitoring device 104 further includes a switching circuit 118 that is configured to selectively connect the secondary switching circuit 116, including the high and low-side secondary resistances $R_{SH}$, $R_{SL}$, to the high voltage bus 102. In the example embodiment shown in FIG. 1, the switching circuit 118 includes a first switch SW1 electrically configured between the high-side secondary resistance $R_{SH}$ and the high-side voltage rail 106, selectively connecting a first end of the high-side secondary resistance $R_{SH}$ to the high-side voltage rail 106. For such embodiments, a second end of the high-side secondary resistance $R_{SH}$ is directly connected to ground GND. In other embodiments, the first switch SW1 is electrically configured between the high-side secondary resistance $R_{SH}$ and ground GND, selectively connecting the second end of the high-side secondary resistance $R_{SH}$ to ground GND. For such embodiments, the first end of the high-side secondary resistance $R_{SH}$ is directly connected to the high-side voltage rail 106. In still other embodiments, the first switch SW1 includes two switches, one electrically configured between the high-side secondary resistance $R_{SH}$ and the high-side voltage rail 106, and a second switch configured between the high-side secondary resistance $R_{SH}$ and ground GND. Various ways of selectively connecting the high-side secondary resistance $R_{SH}$ to the high voltage bus 102 via the high-side voltage rail 106 using one or more switches may be possible.

Additionally, for some embodiments such as shown in FIG. 1, the switching circuit 118 includes a second switch SW2 electrically configured between the low-side secondary resistance $R_{SL}$ and the low-side voltage rail 108, selectively connecting a first end of the low-side secondary resistance $R_{SL}$ to the low-side voltage rail 108. For such embodiments, a second end of the low-side secondary resistance $R_{SL}$ is directly connected to ground GND. In other embodiments, the second switch SW2 is electrically configured between the low-side secondary resistance $R_{SL}$ and ground GND, selectively connecting the second end of the low-side secondary resistance $R_{SL}$ to ground GND. For such embodiments, the first end of the low-side secondary resistance $R_{SL}$ is directly connected to the low-side voltage rail 108. In still other embodiments, the second switch SW2 includes two switches, one electrically configured between the low-side secondary resistance $R_{SL}$ and the low-side voltage rail 108, and a second switch configured between the low-side secondary resistance $R_{SL}$ and ground GND. Various ways of selectively connecting the low-side secondary resistance $R_{SL}$ to the high voltage bus 102 via the low-side voltage rail 108 using one or more switches may be possible.

By configuring the secondary resistance circuit 116 to be selectively connectable to the high voltage bus 102 via the switching circuit 118, the secondary resistance circuit 116 and/or the switching circuit 118 are configurable in different states during different periods of operation. As used herein, a state identifies a particular combination of the high-side secondary resistance $R_{SH}$ being electrically connected to or disconnected from the high voltage bus 102, and the low-side secondary resistance $R_{SL}$ being electrically connected or disconnected from the high voltage bus 102. In addition or alternatively, a state identifies a particular combination of the first switch SW1 in the on state or the off state, and the second switch SW2 in the on state or the off state that configures the high and low-side secondary resistances $R_{SH}$, $R_{SL}$ in a particular combination of being electrically connected to and disconnected from the high voltage bus 102. The variable resistance circuit is configured to change its variable connection to the high voltage bus 102 by configuring the secondary resistance circuit 116 and/or the switching circuit 118 in different states during different periods of operation.

Additionally, different states have different combinations of the high and low-side secondary resistances $R_{SH}$, $R_{SL}$ being electrically connected to or disconnected from the high voltage bus 102, and/or different combinations of the first and second switches SW1, SW2 in on and off states. As an example illustration, in a first state (State 0), both of the first and second switches SW1, SW2 are in off states, and correspondingly, both of the high and low-side secondary resistances $R_{SH}$, $R_{SL}$ are electrically disconnected from the high voltage bus 102. In a second state (State 1), the first switch SW1 is turned off and the second switch SW2 is turned on, and correspondingly, the high-side secondary resistance $R_{SH}$ is electrically disconnected from the high voltage bus 102 and the low-side secondary resistance $R_{SL}$ is electrically connected to the high voltage bus 102. In a third state (State 2), both of the first and second switches SW1, SW2 are in on states, and correspondingly, both of the high and low-side secondary resistances $R_{SH}$, $R_{SL}$ are electrically connected to the high voltage bus 102. In a fourth state (State 3), the first switch SW1 is turned on and the second switch SW2 is turned off, and correspondingly, the high-side secondary resistance $R_{SH}$ is electrically connected to the high voltage bus 102 and the low-side secondary resistance $R_{SL}$ is electrically disconnected from the high voltage bus 102.

In addition, the fault monitoring device 104 may include a high-side voltage measuring circuit 120 that is configured to measure a high-side measurement voltage $V_{MH}$ across the high-side primary resistance $R_{PH}$, and a low-side voltage measuring circuit 122 that is configured to measure a low-side measurement voltage $V_{ML}$ across the low-side primary resistance $R_{PL}$. Since the high-side primary resistance $R_{PH}$ is connected to the high-side voltage rail 106, then the high-side measurement voltage $V_{MH}$ may be considered to correspond to the high-side voltage rail 106, and the measured level (magnitude) of the high-side measurement voltage $V_{MH}$ may be, or may otherwise be proportional to or indicate, the level of the positive rail voltage PRV relative to ground GND. Similarly, since the low-side primary resistance $R_{PL}$ is connected to the low-side voltage rail 108, then the low-side measurement voltage $V_{ML}$ may be considered to correspond to the low-side voltage rail 108, and the measured level (magnitude) of the low-side measurement voltage $V_{ML}$ may be, or may otherwise be proportional to or indicate, the level of the negative rail voltage NRV.

Further, the fault monitoring device 104 may include a controller 124 that is configured to control one or more fault monitoring processes performed by the fault monitoring device 104. The controller 124 is generally an electronic device or circuit, implemented in hardware, or a combination of hardware and software. In various embodiments, the controller 124 includes a processor and a memory. In general, the processor (or processor circuitry) is a component of the controller 124, implemented in hardware alone, or as a combination of hardware and software, that is configured to perform any of various electronic functions described herein. In various embodiments where the controller 124 uses software to perform or carry out a given function, the function may have associated computer code or a set of computer instructions, stored in at least a portion of the memory. The processor is configured, such as a microprocessor, a central processing unit (CPU), or the like, to access the memory and execute the computer code/instructions in order to carry out the function. Also, in various embodiments the controller 124 may use hardware only, such as in the form of digital logic circuitry or the like, to perform a given function. Accordingly, in any of various embodiments, to perform the functions described herein, the processor may use hardware circuitry only to perform functions, execute computer software code/instructions stored in the memory to perform functions, or a combination thereof. In various embodiment, the controller 124 may be or include an integrated circuit (IC), an application specific integrated circuit (ASIC), a field programmable gate array (FPGA), a circuit, a digital logic circuit, an analog circuit, a combination of discrete circuits, gates, or any other type of hardware or combination thereof. In addition, the memory may be implemented according to any of various types of memory configured to store electronic data, including volatile memory, non-volatile memory, combinations therefore, or any other types of memory configured to store data, such in the form of digital bits of information. As mentioned, the memory may store computer code or instructions that the processor is configured to execute in order to carry out one or more of the functions described herein. For example, in various embodiment, the memory may store computer-implemented algorithms, such as the alignment and local best fit algorithms described herein. As another example, the memory stores software that the processor executes to establish a virtual workspace and virtually move data, such as scan mesh data, in the virtual workspace. In addition or alternatively, the memory is configured to store data, such as any of various voltage and/or resistance values the controller 124 determines or calculates.

To control at least one fault monitoring process, the controller 124 may determine states for the secondary resistance circuit 116 and the switching circuit 118, and configure the first and second switches SW1, SW2 in respective on/off states corresponding to the determined states. In addition, the controller 124 may determine at least two voltage levels of at least one of the high-side measurement voltage $V_{MH}$ and the low-side measurement voltage $V_{ML}$, as measured or sensed by the high-side voltage measuring circuit 120 and the low-side voltage measuring circuit 122, respectively. Additionally, in some embodiments as described in further detail below, the controller 124 may determine or calculate at least one sample resistance value corresponding to at least one of the high-side insulation resistance $R_{IH}$ and the low-side insulation resistance $R_{IL}$ based on the at least two determined voltage levels. Based on the at least two determined voltage levels and/or the at least one sample resistance value, the controller 124 may determine a health status of the high voltage bus 102, including whether or not a high-level rail fault, a mid-level rail fault, and/or an internal fault are present in the high voltage bus 102.

In addition, the controller 124 may perform at least one fault monitoring process over a plurality of stages. Each stage may correspond to a respective one of the plurality of states that the secondary resistance circuit 116 and/or the switching circuit 118 are configurable. To perform a current stage of a fault monitoring process, the controller 124 may determine a corresponding state for the secondary resistance circuit 116 that corresponds to the current stage. In turn, the controller 124 may configure the secondary resistance circuit 116 in the corresponding state, such as by configuring each of the first switch SW1 and the second switch SW2 in a respective on/off state that corresponds to the corresponding state, which in turn configures each of the high-side secondary resistance $R_{SH}$ and the low-side secondary resistance $R_{SL}$ as being electrically connected to or disconnected from the high voltage bus 102 corresponding to the corresponding state. With the secondary resistance circuit 116 and the switching circuit 118 configured in the corresponding state, the controller 124 may determine a level of the high-side measurement voltage $V_{MH}$ as measured or sensed by the high-side voltage measuring circuit 120 and a level of the low-side measurement voltage $V_{LH}$ as measured or sensed by the low-side voltage measuring circuit 122 for the current stage. In addition, in some embodiments as described in further detail below, the controller 124 may determine or calculate resistance values for the high-side and low-side insulation resistance values $R_{IH}$, $R_{IL}$ for the current stage based on the levels of the high-side and low-side measurement voltages $V_{MH}$, $V_{ML}$ determined for the current stage. Upon determining the high-side and low-side measurement voltages $V_{MH}$, $V_{ML}$ for the current stage, the controller 124 may move on or transition to a next stage of the fault monitoring process, which becomes the current stage, and may again proceed as described above.

For at least some embodiments, the controller 124 may perform at least one fault monitoring process over the plurality of stages according to a state sequence. In general, a state sequence identifies a predetermined sequence or order of the states in which the controller 124 configures the secondary switching circuit 116 and the switching circuit 118 over the plurality of stages. The state sequence may identify a particular state for a next stage relative to a state corresponding to a current stage. Accordingly, when determining to perform a next stage of at least one fault monitoring process, the controller 124 may determine a corresponding state for the next stage based on the state of the current stage and the state sequence.

In one example embodiment, using the example states described above, the state sequence may be State 0, State 1, State 2, and State 3 repeating. Accordingly, where the controller 124 configures the secondary resistance and switching circuits 116, 118 in State 0 for a current stage, the controller 124 configures the secondary resistance and switching circuits 116, 118 in State 1 for a next stage, and then configures the secondary resistance and switching circuits 116, 118 in State 2 for a third stage, and then configures the secondary resistance and switching circuits in State 3 for a fourth stage. The controller 124 may then reconfigure the secondary resistance and switching circuits 116, 118 in State 0 for a fifth stage, and repeat.

In addition or alternatively, the controller 124 may perform at least one fault monitoring process over a plurality of cycles. The number of stages in a cycle may be equal to the number of different states, and each stage in a cycle may correspond to a different one of the plurality of states. Each cycle may have an associated state sequence or order, such as State 0, State 1, State 2, State 3, as a non-limiting example. For a current cycle, upon performing a last stage corresponding to a last state in the state sequence, the controller 124 may then transition to a next cycle of the fault monitoring process. For example, after performing a last stage corresponding to State 3 of a current cycle, the controller 124 then performs a first stage corresponding to State 0 of a next cycle.

As shown in FIG. 1, when the fault monitoring device 104 is connected to the high voltage bus 102, the primary resistance circuit 114 is connected in parallel with the insulation resistance. Specifically, the high-side primary resistance $R_{PH}$ is connected in parallel with the high-side insulation resistance $R_{IH}$, and the low-side primary resistance $R_{PL}$ is connected in parallel with the low-side insulation resistance $R_{IL}$. As used herein, the term high-side parallel resistance connection refers to the parallel connection of the high-side insulation resistance $R_{IH}$ and the high-side primary resistance $R_{PH}$, and the term low-side parallel resistance connection refers to the parallel connection of the low-side insulation resistance $R_{IL}$ and the low-side primary resistance $R_{PL}$.

In addition, the secondary resistance circuit 116 is configured to selectively connect to the high-side and low-side parallel resistance connections. In particular, when the high-side secondary resistance $R_{SH}$ is electrically connected to the high voltage bus 102, the high-side secondary resistance $R_{SH}$ is connected in parallel with the high-side parallel resistance connection. Conversely, when the high-side secondary resistance $R_{SH}$ is electrically disconnected from the high voltage bus 102, the high-side secondary resistance $R_{SH}$ is not connected in parallel with the high-side parallel resistance connection. Likewise, when the low-side secondary resistance $R_{SL}$ is electrically connected to the high voltage bus 102, the low-side secondary resistance $R_{SL}$ is connected in parallel with the low-side parallel resistance connection. Conversely, when the low-side secondary resistance $R_{SL}$ is electrically disconnected from the high voltage bus 102, the low-side secondary resistance $R_{SL}$ is not connected in parallel with the low-side parallel resistance connection.

By being configured to selectively connect the secondary resistance circuit 116 to the high voltage bus 102, the controller 124 is configured to change the variable connection of the variable resistance circuit to the high voltage bus 102 during a fault monitoring process. In particular, the controller 124 is configured to add or inject different combinations of the high and low-side secondary resistances $R_{SH}$, $R_{SL}$ to the high-side and low-side parallel resistance connections, respectively, over different stages of the fault monitoring process. For example, using the states identified above, when the controller 124 performs a stage corresponding to State 0, the controller 124 does not add or inject either the high-side secondary resistance $R_{SH}$ to the high-side parallel resistance connection or the low-side secondary resistance $R_{SL}$ to the low-side parallel resistance connection. When the controller 124 performs a stage corresponding to State 1, the controller 124 connects in parallel the low-side secondary resistance $R_{SL}$ to the low-side parallel resistance connection, without connecting in parallel the high-side secondary resistance $R_{SH}$ to the high-side parallel resistance connection. When the controller performs a stage corresponding to State 2, the controller 124 both connects the high-side secondary resistance $R_{SH}$ in parallel with the high-side parallel resistance connection, and connects the low-side secondary resistance $R_{SL}$ in parallel with the low-side parallel resistance connection. When the controller performs a stage corresponding to State 3, the controller 124 connects the high-side secondary resistance $R_{SH}$ in parallel with the high-side parallel resistance connection, without connecting in parallel the low-side secondary resistance $R_{SL}$ to the low-side parallel resistance connection.

As mentioned, when the controller 124 performs a given stage of a fault monitoring process, the controller 124 may determine a level of the high-side measurement voltage $V_{MH}$ across the high-side primary resistance $R_{PH}$ and a level of the low-side measurement voltage $V_{ML}$ across the low-side primary resistance $R_{PL}$ for the given stage. In addition, in some embodiments, the controller 124 may calculate sample resistance values corresponding to the high-side and low-side insulation resistances $R_{IH}$, $R_{IL}$ based on the levels of the high-side and low-side measurement voltages $V_{MH}$, $V_{ML}$ for the given stage. As described in further detail below, a sample resistance value may be, or may otherwise indicate, correspond to, or be based on, a resistance value of at least one of the high-side insulation resistance $R_{IH}$ or the low-side insulation resistance $R_{IL}$. For example, as described in further detail below, a sample resistance value may be, or may be a function of at least one of: a resistance value of the high-side parallel resistance connection, a resistance value of the low-side parallel resistance connection, a resistance value of the high-side insulation resistance $R_{IH}$, or a resistance value of the low-side insulation resistance $R_{IL}$.

Further, for at least some embodiments, for a given stage, the controller 124 is configured to determine resistance values for the high-side and low-side parallel resistance connections based on the levels of the high-side and low-side measurement voltages $V_{MH}$, $V_{ML}$, and then determine the resistance values for the high-side and low-side insulation resistances $R_{IH}$, $R_{IL}$ based on the resistance values of the high-side and low-side parallel resistance connections. In particular example embodiments, for a given current stage, the controller 124 determines the resistance values for the high-side and low-side parallel resistance connections further based on levels of the high-side and low-side measurement voltages $V_{MH}$, $V_{ML}$ determined from the prior (i.e., directly or immediately prior) stage.

Additionally, in various embodiments, in some stages, the controller 124 may first determine a resistance value for the high-side parallel resistance connection, and then determine a resistance value for the low-side parallel resistance connection based on the resistance for the high-side parallel resistance connection. For other stages, the controller 124 may first determine a resistance value for the low-side parallel resistance connection, and then determine a resistance value for the high-side parallel resistance connection based on the resistance value for the low-side parallel resistance connection.

In addition, in various embodiments, the controller 124 may be configured to determine resistance values for the high-side and low-side parallel resistance connections, and/or the resistance values for the high-side and low-side insulation resistances $R_{IH}$, $R_{IL}$ according to one or more predetermined mathematical functions or formulas. Also, because the controller 124 adds or injects different combinations of the high and low-side secondary resistances $R_{SH}$, $R_{SL}$ to the high-side and low-side parallel resistance connections according to different states in different stages, the resistance values for the low and high-side parallel resistance connections may be determined according to different mathematical formulas for stages corresponding to the different states. Otherwise stated, the controller 124 may be configured to use the same mathematical formulas for different stages that correspond to the same state, and may use different mathematical formulas for different stages that correspond to different states.

In particular embodiments where the controller 124 performs an insulation monitoring process according to the four States identified above, and over cycles with a state order of {State 0, State 1, State 2, State 3} in each cycle, the controller 124 may determine a resistance value $R_H$ for the high-side parallel resistance connection and a resistance value $R_L$ for each stage according to the following mathematical formulas:

For a current stage corresponding to State 0:

$$R_H = \frac{R_{SL}(U_{ML3}U_{MH0} - U_{ML0}U_{MH3})}{U_{ML0}U_{MH3}} \quad (1)$$

$$R_L = \frac{U_{ML0}R_H}{U_{MH0}} \quad (2)$$

where $R_H$ is the resistance value for the high-side parallel resistance connection, $R_{SL}$ is the resistance value for the low-side secondary resistance $R_{SL}$, $R_L$ is the resistance value for the low-side parallel resistance connection, $U_{ML3}$ is the voltage level of the low-side measurement voltage $V_{ML}$ for the directly prior stage corresponding to State 3, $U_{MH0}$ is the voltage level of the high-side measurement voltage $V_{MH}$ for the current stage corresponding to State 0, $U_{ML0}$ is the voltage level of the low-side measurement voltage $V_{ML}$ for the current stage corresponding to State 0, and $U_{MH3}$ is the voltage level of the high-side measurement voltage $V_{MH}$ for the directly prior stage corresponding to State 3.

For a current stage corresponding to State 1:

$$R_L = \frac{R_{SL}(U_{MH1}U_{ML0} - U_{MH0}U_{ML1})}{U_{MH0}U_{ML1}} \quad (3)$$

$$R_H = \frac{U_{MH0}R_L}{U_{ML0}} \quad (4)$$

where $U_{MH1}$ is the voltage level of the high-side measurement voltage $V_{MH}$ for the current stage corresponding to State 1, $U_{ML0}$ is the voltage level of the low-side measurement voltage $V_{ML}$ for the directly prior stage corresponding to State 0, $U_{MH0}$ is the voltage level of the high-side measurement voltage $V_{MH}$ for the directly prior stage corresponding to State 0, and $U_{ML1}$ is the voltage level of the low-side measurement voltage $V_{ML}$ for the current stage corresponding to State 1.

For a current stage corresponding to State 2:

$$R_L = \frac{R_{SL}(U_{MH1}U_{ML2} - U_{ML1}U_{MH2})}{U_{MH1}U_{MH2} + U_{ML1}U_{MH2} - U_{MH1}U_{ML2}} \quad (5)$$

$$R_H = \frac{R_{SL}R_L U_{MH1}}{R_L U_{ML1} + R_{SL}U_{ML1}} \quad (6)$$

where $U_{MH1}$ is the voltage level of the high-side measurement voltage $V_{MH}$ for the directly prior stage corresponding to State 1, $U_{ML2}$ is the voltage level of the low-side measurement voltage $V_{ML}$ for the current stage corresponding to State 2, $U_{ML1}$ is the voltage level of the low-side measurement voltage $V_{ML}$ for the directly prior stage corresponding to State 1, and $U_{MH2}$ is the voltage level of the high-side measurement voltage $V_{MH}$ for the current stage corresponding to State 2.

For a current stage corresponding to State 3:

$$R_H = \frac{R_{SL}(U_{MH2}U_{ML3} - U_{ML2}U_{MH3})}{U_{ML2}U_{MH3} + U_{ML2}U_{ML3} - U_{MH2}U_{ML3}} \quad (7)$$

$$R_L = \frac{R_{SL}R_H U_{ML3}}{R_H U_{MH3} + R_{SL}U_{MH3}} \quad (8)$$

where $U_{MH2}$ is the voltage level of the high-side measurement voltage $V_{MH}$ for the directly prior stage corresponding to State 2, $U_{ML3}$ is the voltage level of the low-side measurement voltage $V_{ML}$ for the current stage corresponding to State 3, $U_{ML2}$ is the voltage level of the low-side measurement voltage $V_{ML}$ for the directly prior stage corresponding to State 2, and $U_{MH3}$ is the voltage level of the high-side measurement voltage $V_{MH}$ for the current stage corresponding to State 3.

For a given stage, upon determining a pair of resistance values $R_H$, $R_L$ for the high-side and low-side parallel resistance connections, the controller 124 may determine a pair of resistance values for the high-side and low-side insulation resistances $R_{IH}$, $R_{IL}$ based on the pair of resistance values $R_H$, $R_L$ for the given stage according to the following mathematical formulas:

$$R_{IH} = \frac{R_H R_{SL}}{R_{SL} - R_H} \quad (9)$$

$$R_{IL} = \frac{R_L R_{SL}}{R_{SL} - R_L} \quad (10)$$

The above mathematical formulas (1)-(10) may be used by the controller 124 where the resistance values for the high and low-side primary and secondary resistance values $R_{PH}$, $R_{PL}$, $R_{SH}$, $R_{SL}$ are the same. Additionally, for the above mathematical formulas (1)-(10), the voltage levels of the high-side and low-side measurement voltages $V_{MH}$, $V_{ML}$ are positive values, irrespective of whether the high-side and low-side voltage measuring circuit 120, 122 measure them as positive or negative values. For example, if the low-side voltage measuring circuit 122 measures the low-side measurement $V_{ML}$ as a negative value, the level used for mathematical formulas (1)-(10) is an absolute value of the negative value determined by the low-side voltage measuring circuit 122. Variations of the above mathematical formulas (1)-(10), including those that use negative versions of the voltage levels.

In various embodiments, because the controller 124 determines resistance values for the high-side and low-side insulation resistances $R_{IH}$, $R_{IL}$ for a current stage based on levels of the high-side and low-side measurement voltages $V_{MH}$, $V_{ML}$ for the current stage and the directly prior stage, the controller 124, at a minimum, may perform a fault monitoring process over a plurality of stages that corresponds to only two states. For example, the controller 124 may perform a fault monitoring process over a plurality of cycles, where each cycle includes the same two states, such as {State 0, State 1}, {State 1, State 2}, {State 2, State 3}, or {State 3, State 0}. In other embodiments, the controller 124 may perform a fault monitoring process over a plurality of stages that corresponds to more than two states, such as three states or four states. For example, the controller 124 may perform a fault monitoring process over a plurality cycles, where each cycle includes the same three states, such as {State 0, State 1, State 2}, {State 1, State 2, State 3}, {State 2, State 3, State 0}, or {State 3, State 0, State 1}. As another example, the controller 124 may perform a fault monitoring process over a plurality of cycles, where each cycle includes the same four states: {State 0, State 1, State 2, State 3}.

As mentioned, the fault monitoring device 104, is configured to perform at least one fault monitoring process. Three fault monitoring processes are described herein. A first fault monitoring process monitors for high-level rail faults, a second fault monitoring process monitors for mid-level rail faults, and a third fault monitoring process monitors for internal faults, as those faults are described above. For each fault monitoring process, the fault monitoring device 104 may determine an associated fault result, which indicates whether or not the fault monitoring device 104 has detected a fault corresponding to the fault monitoring process. In various embodiments, the fault monitoring device 104 may perform only one, only two, or all three of the fault monitoring processes. Also, in various embodiments, whether the fault monitoring device 104 performs, or at least determines a fault result of, one or more of the fault monitoring processes may depend on a fault result determined from performing another of the fault monitoring processes. Further, for embodiments where the fault monitoring device 104 performs multiple fault monitoring processes, the processes may be considered sub-processes of an overall fault monitoring process.

In addition, the fault monitoring device 104 may perform a single fault monitoring process, or a combination of two or more fault monitoring processes, over multiple stages, as previously described. Within a given stage, the controller 124 may configure the secondary resistance circuit 116 in a state corresponding to the given stage, and with the secondary resistance circuit 116 configured in that state, determine at least two voltage levels of at least one of the high-side measurement voltage $V_{MH}$ measured by the high-side voltage measuring circuit 120 or the low-side measurement voltage $V_{ML}$ measured by the low-side voltage measuring circuit 122.

For embodiments where the fault monitoring device 104 performs the first fault monitoring process to determine whether a high-level rail fault is present, the controller 124 may further determine a pair of sample resistance values based on the voltage measurements, including a first sample resistance value corresponding to the high-side insulation resistance $R_{IH}$ a second sample resistance value corresponding to the low-side insulation resistance $R_{IL}$. In various embodiments, the first sample resistance value is, or is a function of, the high-side insulation resistance $R_{IH}$ and/or the high-side parallel resistance connection $R_H$, and the second sample resistance value is, or is a function of, the low-side insulation resistance $R_{IL}$ and/or the low-side parallel resistance connection $R_L$, such as determined according to equations (1)-(10). For at least one of the stages, the controller 124 may compare the first sample resistance value with a first threshold, and based on the comparison, determine whether a high-level rail fault is present between the high-side voltage rail 106 and ground GND. For example, if the comparison indicates that the first sample voltage is above the first threshold, then the controller 124 may determine that no high-level rail fault is present between the high-side voltage rail 106 and ground GND; and if the comparison indicates that the first sample voltage is below the first threshold, then the controller 124 may determine that a high-level rail fault is present between the high-side voltage rail 106 and ground GND. In addition or alternatively, the controller 124 may compare the second sample resistance value with a second threshold, and based on the comparison, determine whether a high-level rail fault is present between the low-side voltage rail 108 and ground GND. For example, if the comparison indicates that the second sample voltage is above the second threshold, then the controller 124 may determine that no high-level rail fault is present between the low-side voltage rail 108 and ground GND; and if the comparison indicates that the second sample voltage is below the second threshold, then the controller 124 may determine that a high-level rail fault is present between the low-side voltage rail 108 and ground GND. In various embodiments, the first and second thresholds may be the same as or different than each other.

By performing two comparisons with the first and second sample resistance values, the controller 124 may determine not only if a high-level rail fault is present in the high voltage bus 102, but also a location of the high-level fault if one is present, including a location between the high-side voltage rail 106 and ground GND or a location between the low-side voltage rail 108 and ground GND. The controller 124 identifying a location of the high-level fault may facilitate an operator who is immediately attending to the high-level fault.

Also, in some embodiments where the first fault monitoring process is performed, the controller 124 may perform the comparisons and/or determine a fault result in each stage. In other embodiments, the controller 124 may perform the comparisons and/or determine a fault result in less than all of the stages. For example, the controller 124 may perform the comparisons and determine fault results every Nth stage (where N is an integer of two or more). As another example, the controller 124 may perform the comparisons and determine fault results at certain predetermined time intervals. For example, when performing a current stage, then controller 124 may check whether a predetermined time period has elapsed. If not, then the controller 124 may move on to a next stage without performing any comparisons and/or determining any fault results. Alternatively, if the controller 124 determines that a time period has elapsed, then the controller 124 may perform the comparisons and/or determine fault results for the current stage.

In addition, for embodiments where the fault monitoring device 104 performs the second fault monitoring process, the controller 124 may determine at least one sample resistance value, and perform at least one comparison between the at least one sample resistance value and at least one threshold. The controller 124 may determine the at least one sample resistance value based on at least one of the measured voltage levels. The at least one sample resistance value may be different and/or determined differently than the first and second sample resistance values determined when performing the first fault monitoring process, and/or the at least one threshold used in second fault monitoring process may be different than the first and second thresholds used in the first fault monitoring process.

In further detail, a sample resistance value used for the second fault monitoring process may be based on, or associated with, the calculated resistance values for the high-side and low-side insulation resistances $R_{IH}$, $R_{IL}$ to detect a fault and/or a location of the fault. In various embodiments, the sample resistance value may be, or may be a function of, at least one of: one or more resistance values of the high-side parallel resistance connection $R_H$ for one or more stages, one or more resistance values of the low-side parallel resistance connection $R_L$ for one or more stages, one or more resistance values of the high-side insulation resistance $R_{IH}$ for one or more stages, one or more resistance values of the low-side insulation resistance $R_{IL}$ for one or more stages, or any of various combinations (e.g., sums, differences, or averages as non-limiting examples) thereof.

In further examples, a sample resistance value used for the second fault monitoring process may be, or may be a function of: a resistance value of the high-side parallel resistance connection $R_H$ for a single stage; a combination (e.g., a sum or an average) of multiple resistance values of the high-side parallel resistance connection $R_H$ for multiple stages; a resistance value of the low-side parallel resistance connection $R_L$ for a single stage; a combination (e.g., a sum or an average) of multiple resistance values of the low-side parallel resistance connection $R_L$ for multiple stages; a combination (e.g., a difference or an absolute value of a difference) of at least one resistance value (e.g., a single resistance value for a single stage or multiple resistance values for multiple stages) of the high-side parallel resistance connection $R_H$ and at least one resistance value (e.g., a single resistance value for a single stage or multiple resistance values for multiple stages); a resistance value of the high-side insulation resistance $R_{IH}$ for a single stage; a combination (e.g., a sum or an average) of multiple resistance values of the high-side insulation resistance $R_{IH}$ for multiple stages; a resistance value of the low-side insulation resistance $R_{IL}$ for a single stage; a combination (e.g., a sum or an average) of multiple resistance values of the low-side insulation resistance $R_{IL}$ for multiple stages; or a combination (e.g., a difference or an absolute value of a difference) of at least one resistance value (e.g., a single resistance value for a single stage or multiple resistance values for multiple stages) of the high-side insulation resistance $R_{IH}$ and at least one resistance value (e.g., a single resistance value for a single stage or multiple resistance values for multiple stages) of the low-side insulation resistance $R_{IL}$.

Additionally, for at least some example embodiments where a sample resistance value used for the second fault monitoring process is, or is a function of, a combination of multiple resistance values, the multiple resistance values may be those that are for a current stage and a number of directly prior stages, or a number of directly prior stages. The number may be a predetermined integer, or may be a number of stages occurring with a predetermined time period or time window (e.g., a predetermined number of one or more hours or a predetermined number of one or more days, as non-limiting examples) from a current stage or a current time identified by the controller 124. As an example, the sample resistance value may be, or be a function of, a moving average of resistance values determined from a predetermined number of last performed stages or from a number of stages performed within a predetermined time period or time window from a current time or current stage.

In addition, in various embodiments, a sample resistance value for the second fault monitoring process may be a rate of change of a plurality of resistance values. For example, the controller 124 may determine a plurality of resistance values for a number of last performed stages or for a number of stages performed during a moving time window, and may determine a rate of change from the plurality of resistance values. In particular embodiments, the controller 124 may determine a rate of change based on a plurality of moving average values determined over the moving time window. For example, for each current stage, the controller 124 may determine a new moving average value with a new sample resistance value it determined from the current stage. The controller 124 may then determine a new rate of change based on the updated moving average.

Additionally, in various embodiments where the second fault monitoring process is performed, the controller 124 may perform at least one comparison that compares the at least one sample resistance value with at least one threshold. Based on the at least one comparison, the controller 124 may determine whether a mid-level rail fault is present in the high voltage bus 102.

For some embodiments where the second fault monitoring process is performed, the controller 124 may perform only a single comparison of a single sample resistance value with a single threshold. In one non-limiting example, the controller 124 may determine a sample resistance value that is, or is a function of, a difference between a first calculated resistance value corresponding to the high-side voltage rail 106 and a second calculated resistance value corresponding to the low-side voltage rail 108, and compares the difference value with a threshold.

In other embodiments where the second fault monitoring process is performed, the controller 124 may perform multiple comparisons, each with a respective one of multiple sample resistance values and a respective one of multiple thresholds. The controller 124 may determine that a mid-level rail fault is present if at least one of the comparisons so indicate. On the other hand, the controller 124 may determine that a mid-level fault is present is none of the comparisons so indicate. As a non-limiting example of multiple comparisons performed for the second fault monitoring process, the controller 124 may perform a first comparison between a first sample resistance value and a first threshold, and may perform a second comparison between a second sample resistance value and a second threshold, where the first sample resistance value is a moving average of resistance values determined from a predetermined number of last-performed stages or from stages performed over a last predetermined time period, and the second sample resistance value is a rate of change of the resistance values. For this example, the first sample resistance value being below the first threshold may indicate that a mid-level rail fault is present, and the second sample resistance value being above the second threshold may indicate that a mid-level rail fault is present.

Also, for some embodiments where the second fault monitoring process is performed, the controller 124 may determine a difference between a first sample resistance value corresponding to the high-side voltage rail 106 and a second sample resistance value corresponding to the negative low-side rail 108, as mentioned. For these embodiments, by determining a difference, the controller 124 may determine an amount of asymmetry or imbalance between the high-side and low-side insulation resistances $R_{IH}$, $R_{IL}$. The amount of difference, asymmetry, or imbalance may indicate a mid-level rail fault. That is, as long as the difference between the high-side and low-side insulation resistances $R_{IH}$, $R_{IL}$ is relatively small (below a threshold), then the controller 124 may determine that the high-side and low-side insulation resistances $R_{IH}$, $R_{IL}$ are healthy and no faults are imminent. On the other hand, if a difference is sufficiently large (above a threshold), then the controller 124 may determine that a mid-level rail fault is present between.

Also, for at least some embodiments where the controller 124 performs the second fault monitoring process by analyzing a difference (or imbalance or asymmetry) between the high-side and low-side insulation resistances $R_{IH}$, $R_{IL}$, the controller 124 may identify a polarity of the difference to determine a location of the mid-level fault, including a location between the high-side voltage rail 106 and ground GND or between the low-side voltage rail 108 and ground GND. For example, depending on how the difference is calculated, a polarity of the difference (positive or negative) may indicate which of the resistance values is higher than the other. If the controller 124 determines that a magnitude of the difference is sufficiently large (above a threshold) such that a mid-level fault is present, then the controller 124 may determine a polarity of the difference to determine which of the insulation resistances $R_{IH}$, $R_{IL}$ is lower than the other. In turn, the controller 124 may determine the location of the mid-level fault according to which of the insulation resistances $R_{IH}$, $R_{IL}$ is lower That is, if the polarity of the difference indicates that the high-side insulation resistance $R_{IH}$ has the lower calculated value, then the controller 124 may determine that the location of the mid-level rail fault is between the high-side voltage rail 106 and ground GND. On the other hand, if the polarity of the difference indicates that the low-side insulation resistance $R_{IL}$ has the lower calculated value, then the controller 124 may determine that the location of the mid-level rail fault is between the low-side voltage rail 108 and ground GND.

In addition, for embodiments where the fault monitoring device 104 performs the third fault monitoring process, the controller 124 may determine whether an internal fault, internal to the voltage source 110, is present based on voltage levels corresponding to at least one of the high-side voltage rail 106 or the low-side voltage rail 108 and for at least two stages. The voltage levels may be, or may be determined from, at least one of the high-side measurement voltage $V_{MH}$ or the low-side measurement voltage $V_{ML}$.

Accordingly, within a given stage, the controller 124 may determine a sample voltage level, which may be, or may be a function of, a voltage level of the high-side measurement voltage $V_{MH}$, a voltage level of the low-side measurement voltage $V_{ML}$, or a combination of voltage levels of the high-side and low-side measurement voltages $V_{MH}$, $V_{ML}$, such as a sum, difference, product, ratio, or any other form of combination of the two voltage levels. Further, for embodiments where the third fault monitoring process is performed, the controller 124 may determine a first sample voltage level for a current stage, and determine an amount of change between (such as by taking a difference of) the first sample voltage level with a second sample voltage level determined for a last (immediately prior) stage.

Further, the controller 124 may perform at least one comparison of at least one amount of change with at least one threshold. The at least one comparison indicates whether at least one of the high-side voltage rail 106 or the low-side voltage rail 108 has changed above a threshold level between a current stage and the prior stage. If it has, then the at least one comparison may indicate that no internal fault is present. Alternatively, if it has not, then the at least one comparison may indicate that an internal fault is present. In further detail, if no internal fault is present, the changing of states in the secondary resistance circuit 116 from one stage to the next may cause the voltage level of the positive rail voltage PRV to change a threshold amount, may cause the voltage level of the high-side measurement voltage $V_{MH}$ to change a threshold amount, may cause the voltage level of the negative rail voltage NRV to change a threshold amount, and/or may cause the voltage level of the low-side measurement voltage $V_{ML}$ to change a threshold amount. On the other hand, if an internal fault is present, the changing of states in the secondary resistance circuit 116 from a current stage to a next stage may not cause the voltage level changes above a threshold amount. Accordingly, by detecting whether a sample voltage level has changed above a threshold amount between two consecutive stages, the controller 124 may determine whether an internal fault is present.

Additionally, in various embodiments where the third fault monitoring process is performed, the controller 124 may perform at least one comparison that compares at least one voltage level change with at least one threshold. Based on the at least one comparison, the controller 124 may determine whether an internal fault is present. In some embodiments, the controller 124 may determine a single sample voltage level in each stage for the third fault monitoring process. For these embodiments, in a current stage, the controller 124 may determine an amount of change (such as a difference between) a current sample voltage level for the current stage and a prior sample voltage level for the prior stage, and then compare the amount of change with a threshold to determine if an internal fault is present.

In other embodiments, the controller 124 may determine multiple sample voltage levels in each stage for the third fault monitoring process, such as a first sample voltage level corresponding to the high-side voltage rail 106 and a second sample voltage level corresponding to the low-side voltage rail 108. For these embodiments, in a current stage, the controller 124 may determine a first amount change between a current first sample voltage level a prior first sample voltage corresponding to the high-side voltage rail 106, and/or a second amount of change between a current second sample voltage level and a prior second sample voltage level corresponding to the low-side voltage rail 108. The controller 124 may perform a first comparison between the first amount of change and a threshold, and a second comparison between the second amount of change and the threshold, to determine whether an internal fault is present. In some embodiments, the controller 124 may perform the comparisons in sequence. The controller 124 may perform one of the first and second comparisons as an initial comparison, and then perform the other of the first and second comparisons as a subsequent comparison. In various embodiments, whether the controller 124 performs the subsequent comparison may depend on a comparison result of the initial comparison. For example, the controller 124 may perform the subsequent comparison only if the initial comparison indicates an internal fault is present, and determines an internal fault is present only if both comparisons indicate that the internal fault is present. As another example, the controller 124 may perform the subsequent comparison only if the initial comparison indicates an internal fault is not present. That is, if the initial comparison indicates that an internal fault is present, the controller 124 determines that an initial fault is present without performing the sequent comparison. However, if the initial comparison indicates that an internal fault is not present, then the controller 124 performs the subsequent comparison, and determines that an internal fault is present if the subsequent comparison indicates that an internal fault is present. Accordingly, for this example, controller 124 determines that an internal fault is present if at least one of the initial and subsequent comparisons indicates that an internal fault is present, and determines that an internal fault is not present only if neither of the comparisons indicate that an internal fault is not present. In other of various embodiments, the controller 124 always performs both comparisons, and determines an internal fault is present only if both comparisons indicate that the internal fault is present. If at least one of the comparisons indicates that an internal fault is not present, then the controller 124 determines that an internal fault is not present.

In addition, in some embodiments of the third fault monitoring process, in response to determining that an internal fault is present, the controller 124 may further determine an internal location of the internal fault. An internal location of an internal fault may be or indicate a location or point, such as a connection point, that the internal fault is between and ground GND. As mentioned, an internal location of the voltage source 110 may be a point between two battery cells. Accordingly, in some embodiments of the third fault monitoring process, by determining an internal location of an internal fault, the controller 124 identifies a point between two battery cells 112, among a plurality of different points between different battery cells within the voltage source 110. The controller 124 may identify the point by identifying two battery cells that the point is between.

Also, the controller 124 may determine an internal location based on the sample voltage levels, including a first sample voltage level corresponding to the high-side voltage rail 106 and a second sample voltage level corresponding to the low-side voltage rail 108. In particular embodiments, the controller 124 may determine a ratio between the first sample voltage level and the second sample voltage level, which in turn may be equal or proportional to a ratio of a number of battery cells 112 between the internal fault location and the high-side voltage rail 106 and a number of battery cells 112 between the internal fault location and the low-side voltage rail 108.

As an example illustration, suppose the voltage source 110 has ten battery cells 112, with each battery cell 112 having 1 V. Further, suppose that over two stages, including a prior stage and a current stage, the controller 124 determines a magnitude of the negative rail voltage NRV to be effectively constant at 4 V (i.e., a change in magnitude of the negative rail voltage NRV between the prior and current stages is below a threshold level), and a magnitude of the positive rail voltage PRV to be effectively constant at 6 V (i.e., a change in magnitude of the positive rail voltage PRV between the prior and current stages is below a threshold level), yielding a PRV-to-NRV ratio of 6 to 4. In turn, the ratio may indicate to the controller 124 that the internal fault location is six battery cells from the high-side voltage rail 106 and four battery cells from the low-side voltage rail 108, or between the fourth and fifth battery cells. As another example, suppose that over two stages, including a prior stage and a current stage, the controller 124 determines a magnitude of the negative rail voltage NRV to be effectively constant at 3 V (i.e., a change in magnitude of the negative rail voltage NRV between the prior and current stages is below a threshold level) and a magnitude of the positive rail voltage to be effectively constant at 7 V (i.e., a change in magnitude of the positive rail voltage PRV between the prior and current stages is below a threshold level), yielding a PRV-to-NRV ratio of 7 to 3. In turn, the ratio may indicate to the controller 124 that the internal fault location is seven battery cells from the high-side voltage rail 106 and three battery cells from the low-side voltage rail 108, or between the third and fourth battery cells.

In addition or alternatively, in any of various embodiments, the controller 124 may save the any of the various voltage levels and/or calculated resistance values for the plurality of stages over time, such as historical data. As described in further detail below, the historical data may be used to track how the high-side and low-side insulation resistances $R_{IH}$, $R_{IL}$ change over time, either internally by the controller 124, or by an operator, such as by viewing the historical data on a display. The historical data may be used for predictive maintenance by providing data that can be used, either internally by the controller 124 or by an operator receiving the data, for insulation health prognostics, which in turn can provide cost savings.

Further, in various embodiments such as shown in FIG. 1, the system 100 may include an output device 126 in electrical communication with the controller 124. The output device 126 may be any device configured to output an output signal associated with at least one fault monitoring process. The output signal may be in the form of at least one of: audio signals, video signals, or light signals associated with the at least one fault monitoring process. In various embodiments, the output device 126 may include at least one of a speaker, a display, or a light source.

In some embodiments, the output device 126 is a component of the fault monitoring device 104. For example, the fault monitoring device 124 itself may include a display, a speaker, and/or a light source. In other embodiments, the output device 126 may be a component separate from the fault monitoring device 104. For these latter embodiments, the controller 124, and/or the fault monitoring device 104 as a whole, may be configured to communicate with the separate output device 126 via any of various wired and/or wireless electrical connections to communicate one or more signals to and/or from the output device 126 to cause the output device 126 to output any of various audio, video, and/or light signals. For example, in some embodiments, the fault monitoring device 104 and the output device 126 may be configured to form and/or connect to one or more of any of various types of communication networks, such as in accordance with any of various types of standards or protocols (e.g., a local area network, a wireless local area network, a wide area network, a metropolitan area network, a cloud computing network, a virtual private network, a controller area network (CAN), a personal area network, a cellular network, the Internet, as non-limiting examples) and communicate with each other via the one or more networks. Accordingly, the actual output device 126 of the monitoring device 104 may be in the form of any of various types of transmitter or transceiver circuitry, such as a connector, port, and/or antenna or antenna array, that is configured to wirelessly communicate (send and receive) signals and/or connect to a wired connection (e.g., an Ethernet or a coaxial cable) or a communication bus (e.g., a CAN bus), for communication over the one or more networks. In other embodiments, the fault monitoring device 104 may communicate with the output device 126 via a wired and/or wireless connection without connection to or use of a network. Various ways of configuring an output device 126 to be in electrical communication with the controller 124 of the fault monitoring device 104 for output of one or more signals related to the fault monitoring performed by the fault monitoring device 104 may be possible.

Additionally, in various embodiments, the output signal may indicate a health status of the power system 100. The health status may indicate whether a fault is detected. If the controller 124 determines there are no faults from performing the at least one fault monitoring process, the output device 126 does not output anything, the silence or absence of the output signal indicating that the power system 100 is healthy, which in turn may indicate to an operator that the power system 100 is not experiencing any faults and no action is required. In other embodiments, the output signal may expressly indicate that no fault is detected. For example, the output device 126 may be in the form of a display that displays text or another type of graphic indicating that no fault is present. As another example, the output device 126 may output a light signal a certain way (such as with a certain color, e.g., green) indicating that no fault has been detected.

In addition, if the controller 124 has detected a fault, the output device 126 may output an output signal to indicate that a fault is detected. Also, in various embodiments, the output signal may indicate a type of the detected fault, such as whether the fault is a high-level rail fault, a mid-level rail fault, or an internal fault. In addition or alternatively, in various embodiments, the controller 124 may output the output signal to indicate a location of the fault, such as if the fault is between the high-side voltage rail 106 and ground GND, or between the low-side voltage rail 108 and ground GND. The output device 126 may output an output signal in any of various ways, audibly and/or visibly, to indicate the detected fault. For example, the output device 126 may be a speaker that outputs an audio signal, such as in the form of an alarm or a voice. In addition or alternatively, the output device 126 may be a light source that output a light signal, such as a flashing light signal or with a certain color. In addition or alternatively, the output device 126 is a display that displays information that a fault is detected, the type of fault, and/or a location of the detected fault.

In addition or alternatively, the output device 126 may be configured to output any of the determined voltage levels and/or resistance values it determines for the stages. For example, the output device 126, such as one configured as a display, may be configured to output the voltage levels and/or resistance values as a list or in a table, or in graphical format, such as a function of time and/or stages performed.

Figure 2:
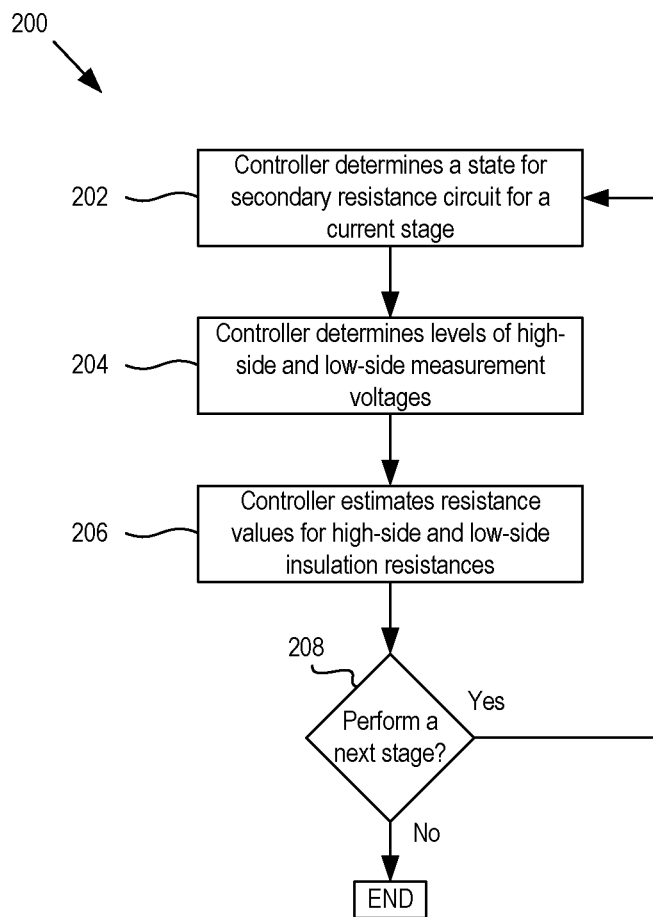
FIG. 2 shows a flow chart of an example method of performing an insulation resistance calculation process.

FIG. 2 shows a flow chart of an example method 200 of performing an insulation resistance calculation process. The method 200 is described with reference to the fault monitoring device 104 of FIG. 1. At block 202, the controller 124 determines a state, of a plurality of states, in which to configure the secondary resistance circuit 116 for a current stage, and configures the secondary resistance circuit 116 in the determined state, such as by configuring switches SW1, SW2 of the switching circuit 116 in respective on/off states corresponding to the determined state. At block 204, in response to the secondary resistance circuit 116 being configured in the current state, the controller 124 determines a level of the high-side measurement voltage $V_{MH}$ across the high-side primary resistance $R_{PH}$ measured by the high-side voltage measuring circuit 120, and determines a level of the low-side measurement voltage $V_{ML}$ across the low-side primary resistance $R_{PL}$ measured the low-side voltage measuring circuit 122. Also, in various embodiments, the method 200 may further include the high-side and low-side voltage measuring circuits 120, 122 measuring the high-side and low-side measurement voltages $V_{MH}$, $V_{ML}$ before the controller 124 determines the levels of the high-side and low-side measurement voltages $V_{MH}$, $V_{ML}$. Also, in various embodiments, the controller 124 may wait for a predetermined time period to allow transient voltages to settle before the high-side and low-side voltage measuring circuits 120, 122 measure the high-side and low-side measurement voltages $V_{MH}$, $V_{ML}$, and/or the controller 124 determines the levels of the high-side and low-side measurement voltages $V_{MH}$, $V_{ML}$. At block 206, the controller 124 may determine or calculate a resistance value of a high-side insulation resistance $R_{IH}$ and a resistance value of a low-side insulation resistance $R_{IL}$ based on the levels of the high-side and low-side measurement voltages $V_{MH}$, $V_{ML}$. In various embodiments, the resistance values of the high-side and low-side insulation resistances $R_{IH}$, $R_{IL}$ may be based, or determined from, resistance values of a high-side parallel resistance connection of the high-side primary resistance $R_{PH}$ and the high-side insulation resistance $R_{IH}$ and a low-side parallel resistance connection of the low-side primary resistance $R_{PL}$ and the low-side insulation resistance $R_{IL}$. Also, in various embodiments, the resistance values of the high-side and low-side parallel resistance connections may be based on the voltage levels of the high-side and low-side measurement voltages $V_{MH}$, $V_{ML}$ measured for the current stage and voltage levels of the high-side and low-side measurement voltages $V_{MH}$, $V_{ML}$ measured for the directly prior stage. Additionally, in various embodiments, the controller 124 may communicate with the output device 126 to output the resistance values calculated at block 206. At block 208, the controller 124 may determine whether to perform a next stage of the insulation monitoring process. If not, then the method 200 may end. If so, then the method 200 may proceed back to block 202, where the controller 124 performs the next stage.

Figure 3:
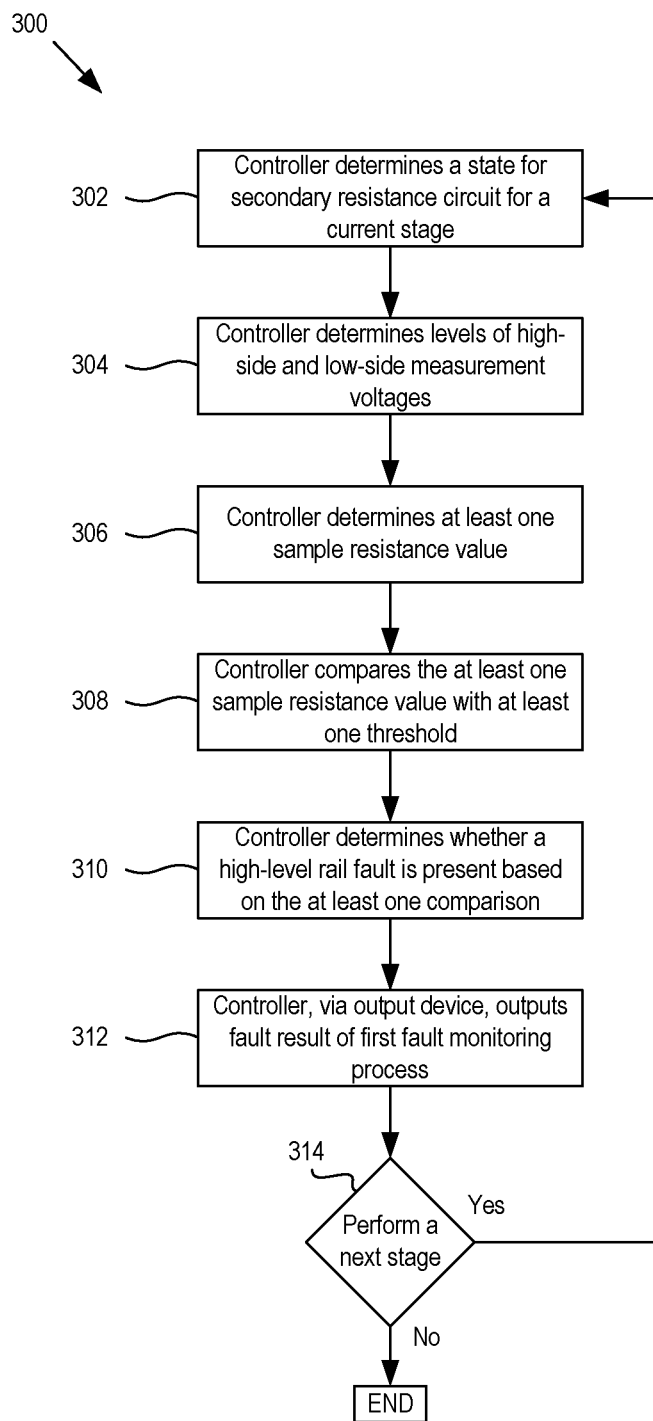
FIG. 3. shows a flow chart of an example method of performing a fault monitoring process to monitor for a high-level rail fault.

FIG. 3 shows a flow chart of an example method 300 of performing the first fault monitoring process to detect whether a high-level fault is present in the high voltage bus 102. The method 300 is described with reference to the fault monitoring device 104 of FIG. 1. At block 302, the controller 124 determines a state, of a plurality of states, in which to configure the secondary resistance circuit 116 for a current stage, and configures the secondary resistance circuit 116 in the determined state, such as by configuring switches SW1, SW2 of the switching circuit 116 in respective on/off states corresponding to the determined state. At block 304, in response to the secondary resistance circuit 116 being configured in the current state, the controller 124 determines a level of the high-side measurement voltage $V_{MH}$ across the high-side primary resistance $R_{PH}$ measured by the high-side voltage measuring circuit 120, and determines a level of the low-side measurement voltage $V_{ML}$ across the low-side primary resistance $R_{PL}$ measured the low-side voltage measuring circuit 122.

At block 306, the controller 124 determines at least one sample resistance value corresponding to at least one of the high-side voltage rail 106 or the low-side voltage rail 108. An example sample resistance value corresponding to the high-side voltage rail 106 is, or is a function of, a resistance value of the high-side parallel resistance connection $R_H$ or the high-side insulation resistance $R_{IH}$. An example sample resistance value corresponding to the low-side voltage rail 108 is, or is a function of, a resistance value of the low-side parallel resistance connection $R_L$ or the low-side insulation resistance $R_{IL}$. For at least some embodiments, the controller 124 calculates at least one of the high-side parallel resistance connection $R_H$, the high-side insulation resistance $R_{IH}$, the low-side parallel resistance connection $R_L$, or the low-side insulation resistance $R_{IL}$ according to equations (1)-(10) identified above.

At block 308, the controller 124 may compare the at least one sample resistance value with at least one threshold. For example, the controller 124 may perform a first comparison that compares a first sample resistance value corresponding to the high-side voltage rail 106 with a first threshold, and/or may perform a second comparison that compares a second sample resistance value corresponding to the low-side voltage rail 108 with a second threshold. At block 310, the controller 124 may determine whether a high-level rail fault is present based on the at least one comparison. For example, if the first comparison indicates that the first sample resistance value corresponding to the high-side voltage rail 106 is below the first threshold and/or if the second comparison indicates that the second sample resistance value corresponding to the low-side voltage rail 108 is below the second threshold, then the controller 124 may determine that a high-level rail fault is present. Further, in some example embodiments, if the controller 124 determines that a high-level rail fault is present, the controller 124 may further determine a location of the high-level rail fault. For example, if the first comparison indicates that high-level rail fault is present, then the controller 124 may identify that the high-level rail fault is between the high-side voltage rail 106 and ground GND. Additionally, if the second comparison indicates that the high-level rail fault is present, then the controller 124 may identify that the high-level rail fault is between the low-side voltage rail 108 and ground GND.

For at least some embodiments, the method 300 may further include a block 312, where the controller 124, via the output device 126, outputs at least one output signal indicative of the fault result determined at block 310. At block 314, the controller 314 may determine whether to perform a next stage. If so, then the method 300 may proceed back to block 302. In some embodiments, the controller 314 determines to perform a next stage if no high-level fault is detected at block 310. Otherwise, if a high-level fault is detected, then the method 300 may end.

Figure 4:
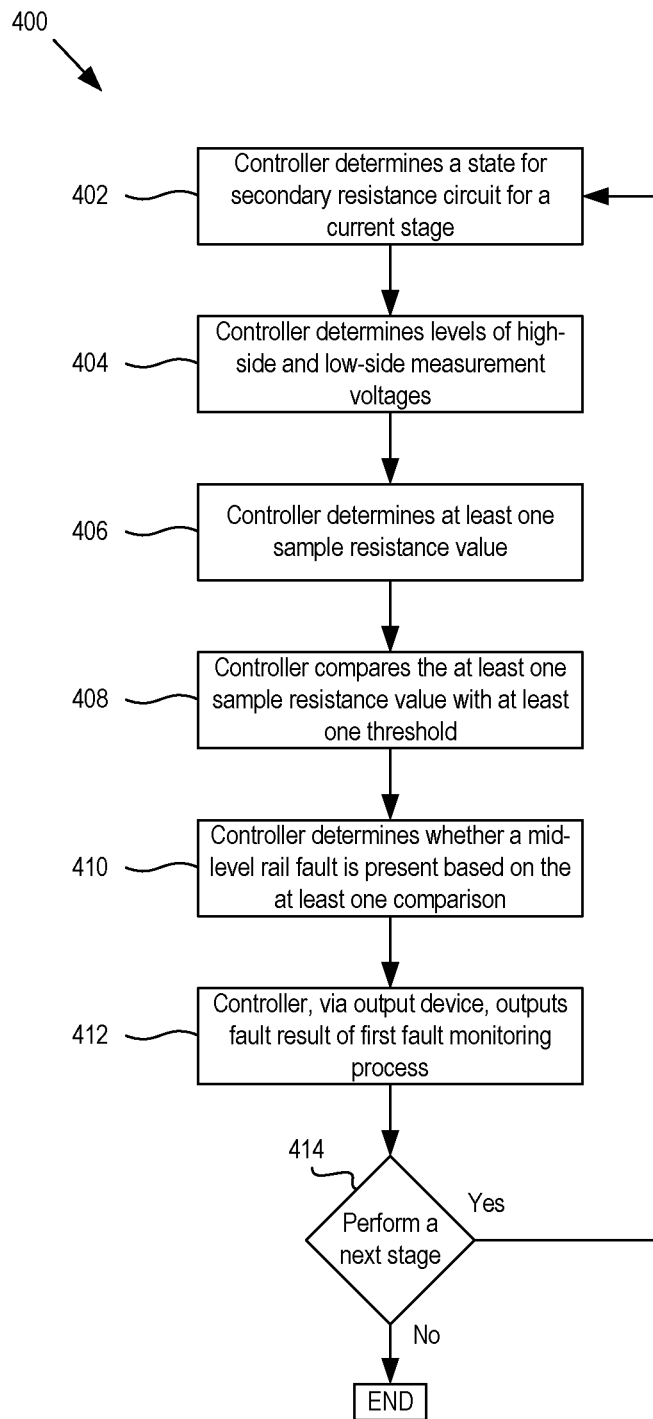
FIG. 4 shows a flow chart of an example method of performing a fault monitoring process to monitor for a mid-level rail fault.

FIG. 4 shows a flow chart of an example method 400 of performing the second fault monitoring process to detect whether a mid-level fault is present in the high voltage bus 102. The method 400 is described with reference to the fault monitoring device 104 of FIG. 1. At block 402, the controller 124 determines a state, of a plurality of states, in which to configure the secondary resistance circuit 116 for a current stage, and configures the secondary resistance circuit 116 in the determined state, such as by configuring switches SW1, SW2 of the switching circuit 116 in respective on/off states corresponding to the determined state. At block 404, in response to the secondary resistance circuit 116 being configured in the current state, the controller 124 determines a level of the high-side measurement voltage $V_{MH}$ across the high-side primary resistance $R_{PH}$ measured by the high-side voltage measuring circuit 120, and determines a level of the low-side measurement voltage $V_{ML}$ across the low-side primary resistance $R_{PL}$ measured the low-side voltage measuring circuit 122.

At block 406, the controller 124 determines at least one sample resistance value corresponding to at least one of the high-side voltage rail 106 or the low-side voltage rail 108. In particular embodiments, the at least one sample resistance value may include at least one of: a difference between a resistance value corresponding to the high-side voltage rail 106 and a resistance value corresponding to the low-side voltage rail 108, a moving average of resistance values corresponding to at least one of the high-side voltage rail 106 or the low-side voltage rail 108 determined from a number of previously performed stages, or a rate of change of resistance values corresponding to at least one of the high-side voltage rail 106 or the low-side voltage rail 108 determined from a number of previously performed stages.

At block 408, the controller 124 may compare the at least one sample resistance value with at least one threshold. At block 410, the controller 124 may determine whether a mid-level rail fault is present based on the at least one comparison. For example, if the sample resistance value is a difference, and the comparison indicates that the difference is greater than a threshold, then the controller 124 may determine that a mid-level rail fault is present. As another example, if the sample resistance value is a moving average of resistance values, and the comparison indicates that the moving average is less than a threshold, then the controller 124 may determine that a mid-level rail fault is present. In still another example, if the sample resistance value is a rate of change of resistance values, and the comparison indicates that the rate of change is above a threshold, then the controller 124 may determine that a mid-level rail fault is present. Further, in some example embodiments, if the controller 124 determines that a mid-level rail fault is present, the controller 124 may further determine a location of the mid-level rail fault. For example, if the sample resistance value is a difference, then the controller 124 may identify which of the high-side and low-side insulation resistances $R_{IH}$, $R_{IL}$ is lower, and in turn identify whether the mid-level rail fault is between the high-side voltage rail 106 and ground GND or between the low-side voltage rail 108 and ground GND.

For at least some embodiments, the method 400 may further include a block 412, where the controller 124, via the output device 126, outputs at least one output signal indicative of the fault result determined at block 410. At block 414, the controller 124 may determine whether to perform a next stage. If so, then the method 400 may proceed back to block 402. In some embodiments, the controller 414 determines to perform a next stage if no mid-level fault is detected at block 410. Otherwise, if a mid-level fault is detected, then the method 400 may end.

Figure 5:
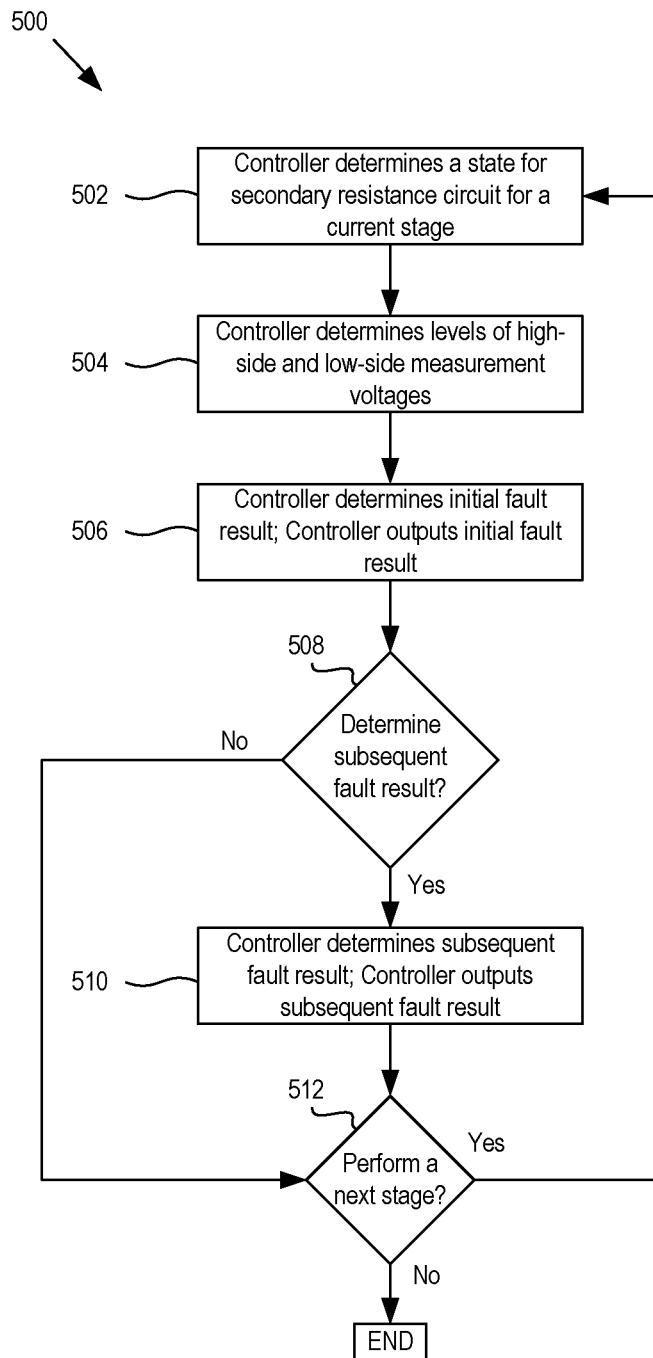
FIG. 5 shows a flow chart of an example method of performing a fault monitoring process to monitor for a combination of a high-level rail fault and a mid-level rail fault.

FIG. 5 shows a flow chart of an example method 500 of performing the first and second fault monitoring processes in combination. The method 500 is described with reference to the fault monitoring device 104 of FIG. 1. In the method 500, the fault monitoring device 104 may make a fault determination for one of the first and second fault monitoring processes before determining a fault result for the other of the first and second fault monitoring processes. The fault result that the fault monitoring device 104 determines first is referred to as an initial fault result, and the fault that the fault monitoring device 104 determines second is referred to as a subsequent fault result. Also, the fault monitoring process for which the initial fault result is determined is referred to as the initial fault monitoring process, and the fault monitoring process for which the subsequent fault result is determined is referred to as the subsequent fault monitoring process. In some embodiments of the method 500, the initial fault monitoring process is the first fault monitoring process, and the subsequent fault monitoring process is the second fault monitoring process. In other embodiments of the method 500, the initial fault monitoring process is the second fault monitoring process, and the subsequent fault monitoring process is the first fault monitoring process.

In further detail, at block 502, the controller 124 determines a state, of a plurality of states, in which to configure the secondary resistance circuit 116 for a current stage, and configures the secondary resistance circuit 116 in the determined state, such as by configuring switches SW1, SW2 of the switching circuit 116 in respective on/off states corresponding to the determined state. At block 504, in response to the secondary resistance circuit 116 being configured in the current state, the controller 124 determines a level of the high-side measurement voltage $V_{MH}$ across the high-side primary resistance $R_{PH}$ measured by the high-side voltage measuring circuit 120, and determines a level of the low-side measurement voltage $V_{ML}$ across the low-side primary resistance $R_{PL}$ measured the low-side voltage measuring circuit 122.

At block 506, the controller 124 may determine an initial fault result for an initial fault monitoring process. Additionally, in various embodiments, the controller 124, via the output device 126, may output the initial fault result. For embodiments where the initial fault monitoring process is the first fault monitoring process, the controller 124 may determine the initial fault result by determining at least one sample resistance value, comparing the at least one sample resistance value with at least one threshold, and determining whether a high-level rail fault is present based on the at least one comparison, such as described above for blocks 306, 308, and 310 in the method 300 of FIG. 3. Additionally, for embodiments where the initial fault monitoring process is the second fault monitoring process, the controller 124 may determine the initial fault result by determining at least one sample resistance value, comparing the at least one sample resistance value with at least one threshold, and determining whether a mid-level rail fault is present based on the at least one comparison, such as described above for blocks 406, 408, and 410 in the method 400 of FIG. 4.

At block 508, the controller 124 may determine whether to determine the subsequent fault result. The determination may depend on which of the fault monitoring processes is initial fault monitoring process and the initial fault result. Specifically, for embodiments where the initial fault monitoring process is the first fault monitoring process and the initial fault result is that a high-level rail fault is present, then the controller 124 may determine to output that a high-level rail fault is detected, and stop further fault monitoring, including not determining the subsequent fault result. On the other hand, if the initial fault result is that no high-level rail fault is present, then the controller 124 may determine to perform the subsequent, second fault monitoring process to determine whether a mid-level rail fault is present. Accordingly, for this latter situation, the method 500 may proceed to block 510 where the controller 124 determines the subsequent fault result, which is whether a mid-level fault is present. At block 510, if the controller 124 has not already done so, the controller 124 may determine at least one sample resistance value for the second fault monitoring process, compare the at least one sample resistance value with at least one threshold, and determine whether a mid-level rail fault is present based on the at least one comparison, such as described with reference to blocks 406, 408, 410 in the method 400 of FIG. 4.

Additionally, for embodiments where the initial fault monitoring process is the second fault monitoring process and the initial fault result is that a mid-level rail fault is not present, then the controller 124 may determine to not determine the subsequent fault result—i.e., whether a high-level rail fault is present—and proceed to block 512, where the controller 124 may determine whether to perform a next stage. On the other hand, if the initial fault result is that a mid-level rail fault is present, then the controller 124 may determine to perform the subsequent, first fault monitoring process to determine whether a high-level rail fault is present. Accordingly, at block 510, if the controller 124 has not already done so, the controller 124 may determine at least one sample resistance value for the first fault monitoring process, compare the at least one sample resistance value with at least one threshold, and determine whether a high-level rail fault is present based on the at least one comparison, such as described with reference to blocks 306, 308, 310 in the method 300 of FIG. 3.

The controller 512 may then proceed to block 512, and determine whether to perform a next stage. If so, then the method 500 may proceed back to block 502 and perform a next stage. If not, then the method 500 may end.

Figure 6:
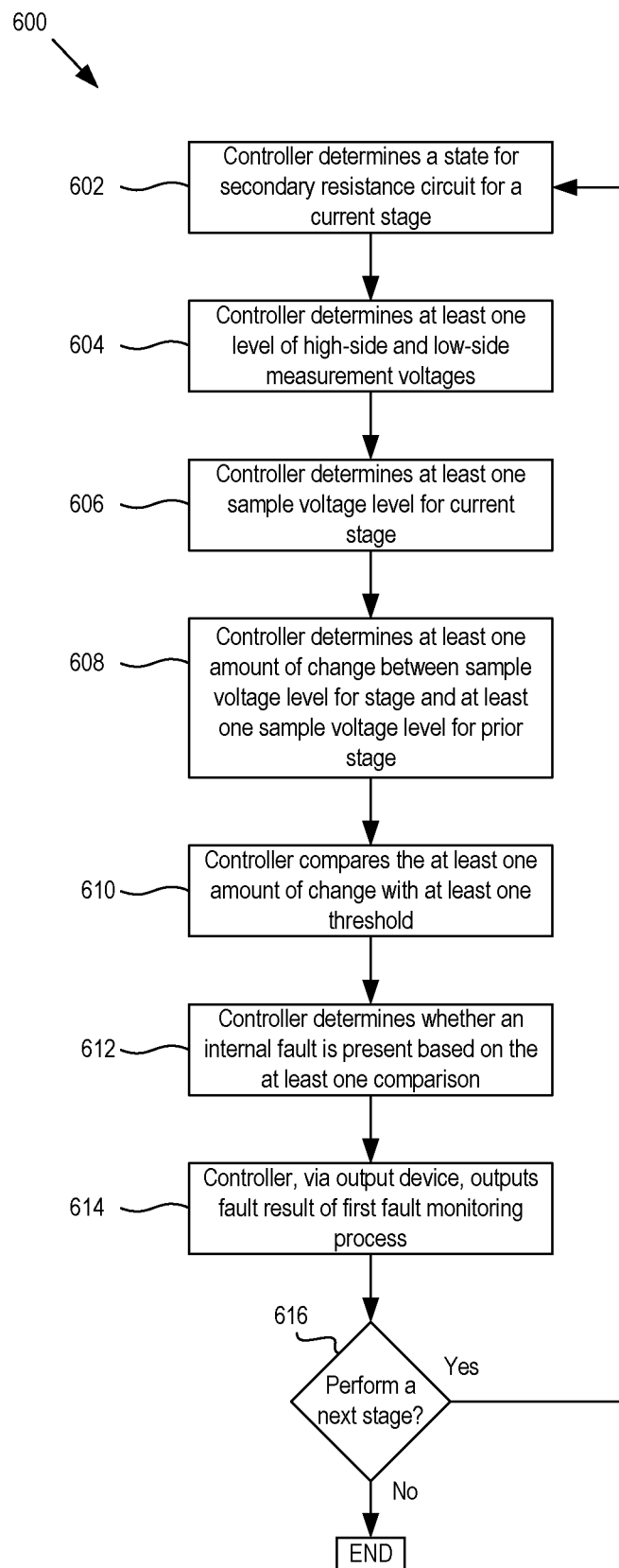
FIG. 6 shows a flow chart of an example method of performing a fault monitoring process to monitor for an internal fault.

FIG. 6 shows a flow chart of an example method 600 of performing the third fault monitoring process to detect whether an internal fault, internal to the voltage source 110, is present in the high voltage bus 102. The method 600 is described with reference to the fault monitoring device 104 of FIG. 1. At block 602, the controller 124 determines a state, of a plurality of states, in which to configure the secondary resistance circuit 116 for a current stage, and configures the secondary resistance circuit 116 in the determined state, such as by configuring switches SW1, SW2 of the switching circuit 116 in respective on/off states corresponding to the determined state.

At block 604, in response to the secondary resistance circuit 116 being configured in the current state, the controller 124 determines a level of the high-side measurement voltage $V_{MH}$ across the high-side primary resistance $R_{PH}$ measured by the high-side voltage measuring circuit 120 and/or a level of the low-side measurement voltage $V_{ML}$ across the low-side primary resistance $R_{PL}$ measured the low-side voltage measuring circuit 122. At block 606, the controller 124 determines at least one sample voltage level for the current stage that is, or is a function of, at least one of the high-side measurement voltage $V_{MH}$ or the low-side measurement voltage $V_{ML}$.

At block 608, the controller 124 determines at least one amount of change between the at least one sample voltage level for the current stage and at least one sample voltage level determined from an immediately prior stage. At block 610, the controller 124 compares the at least one amount of change with at least one threshold. At block 612, the controller determines whether an internal fault is present based on the comparison. For example, if an amount of change is above a threshold, then the controller 124 determines that no internal fault is present. If the amount of change is below a threshold, then the controller 124 determines that an internal fault is present. Also, in some embodiments, if the controller 124 determines that an internal fault is present, the controller 124 may further determine an internal fault location of the internal fault, such as a connection point between two battery cells 112. As described, the controller 124 may determine the internal fault location based on a first sample voltage level corresponding to the high-side voltage rail 106 and a second sample voltage level corresponding to the low-side voltage rail 108, such as a ratio between the first sample voltage level and the second sample voltage level.

For at least some embodiments, the method 600 may further include a block 614, where the controller 124, via the output device 126, outputs at least one output signal indicative of the fault result determined at block 512. Also, in various embodiments, the controller 124 may output, via the output device 126, an internal fault location if it determines one. At block 616, the controller 124 may determine whether to perform a next stage. If so, then the method 500 may proceed back to block 602. In some embodiments, the controller 124 determines to perform a next stage if no internal fault is detected at block 612. Otherwise, if an internal fault is detected or the controller 124 otherwise determines not to perform a next stage, then the method 600 may end.

Figure 7:
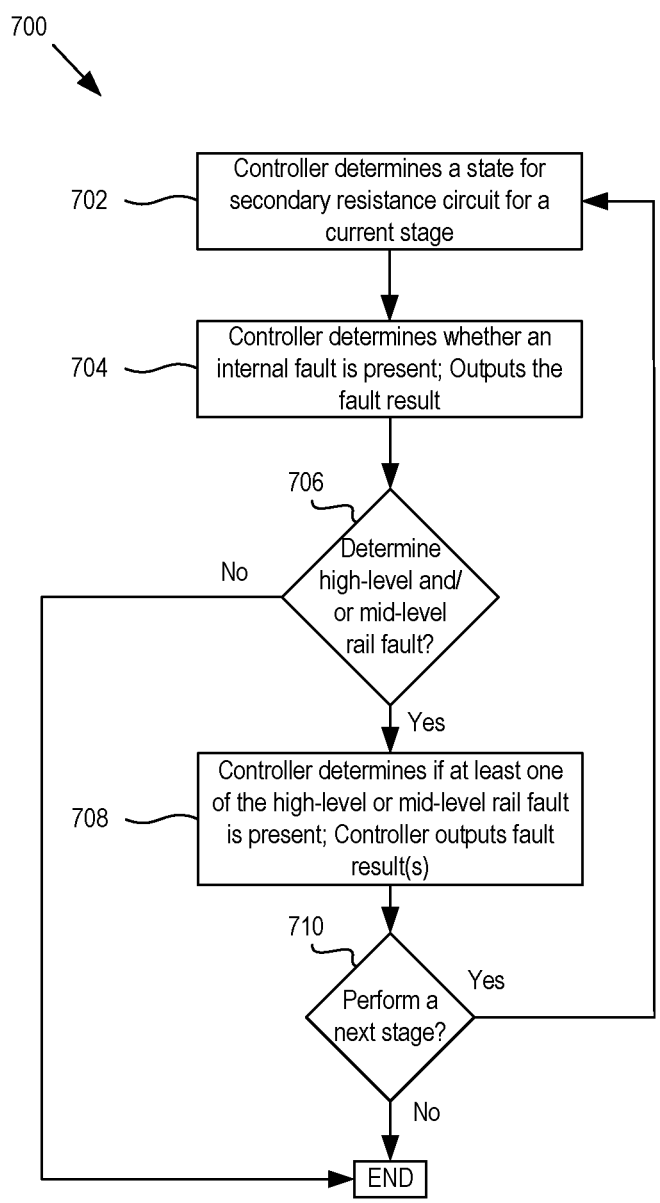
FIG. 7 shows a flow chart of an example method of performing a fault monitoring process to monitor for an internal fault in combination with at least one of a high-level rail fault or a mid-level rail fault.

FIG. 7 shows a flow chart of an example method 700 of performing the third fault monitoring process in combination with at least one of the first or second fault monitoring processes. The method 700 is described with reference to the fault monitoring device 104 of FIG. 1. In the method 700, the fault monitoring device 104 may make a fault determination for the third fault monitoring processes before determining at least one fault result for at least one of the first or second fault monitoring processes. In the example method 700, whether the fault monitoring device 104 performs the first and/or second fault monitoring processes may depend on a fault result of the third monitoring process. Specifically, if the controller 124 determines that an internal fault is present, then the controller 124 may not perform any of the first and second fault monitoring processes. Alternatively, if the controller 124 determines that an internal fault is not present, then the controller 124 may perform at least one of the first or second fault monitoring processes.

In further detail, at block 702, the controller 124 determines a state, of a plurality of states, in which to configure the secondary resistance circuit 116 for a current stage, and configures the secondary resistance circuit 116 in the determined state, such as by configuring switches SW1, SW2 of the switching circuit 116 in respective on/off states corresponding to the determined state. At block 704, the controller 124 determines whether an internal fault is present in the high voltage bus 102, such as by determining at least one level of the high-side and low-side measurement voltages $V_{MH}$, $V_{ML}$, determining at least one sample voltage level for the current stage, determine at least one amount of change between the at least one sample voltage level for the current stage and at least one sample voltage level for a prior stage, comparing the at least one amount of with at least one threshold, and determining whether an internal fault is present based on the at least one comparison, such as described with reference to blocks 604-612 of the method 600 of FIG. 6. Also, in various embodiments, at block 704, the controller 124, such as via the output device 126, may output the fault result determined at block 704. Also, in some embodiments, if the controller 124 determines that an internal fault is present, the controller 124 may further determine an internal fault location of the internal fault, such as a connection point between two battery cells 112. As described, the controller 124 may determine the internal fault location based on a first sample voltage level corresponding to the high-side voltage rail 106 and a second sample voltage level corresponding to the low-side voltage rail 108, such as a ratio between the first sample voltage level and the second sample voltage level. Also, the controller 124 may output the internal fault location, such as via the output device 126, in various embodiments.

At block 706, the controller 124 may determine whether to determine whether a high-level rail fault is present and/or a mid-level rail fault is present. Specifically, if the controller 124 determines that an internal fault is present, then the controller 124 may determine not to determine whether a high-level rail fault is present and whether a mid-level rail fault is present, and the method 700 may end. Alternatively, if the controller 124 determines that an internal fault is not present, then the method 700 may proceed to block 708, where the controller 124 may determine at least one of whether a high-level rail fault is present or a mid-level rail fault is present. For some embodiments, the controller 124 may determine only if a high-level rail fault is present according to the first fault monitoring process. For such embodiments, the controller 124 may perform blocks 304 to 310 of the method 300 as previously described to determine whether a high-level rail fault is present. For other embodiments, the controller 124 may determine only if a mid-level rail fault is present according to the second fault monitoring process. For such embodiments, the controller 124 may perform blocks 404 to 410 of the method 400, as previously described to determine whether a mid-level rail fault is present. For still other embodiments, the controller 124 may determine a combination of whether the high-level and mid-level rail faults are present. For these embodiments, the controller 124 may determine an initial fault result and optionally a subsequent fault result dependent on the initial fault result, such as by performing blocks 506, 508, 510, in combination with any of the blocks of FIGS. 3 and 4, as previously described with reference to the method 500 of FIG. 5. Also, in various embodiments, at block 708, the controller 124, via the output device 126, may output one more output signals indicating whether a high-level rail fault and/or a mid-level rail fault is present. At block 710, the controller 124 may determine whether to perform a next stage. If so, then the method 700 may proceed back to block 702. If not, then the method 700 may end.

While various embodiments have been described, it will be apparent to those of ordinary skill in the art that many more embodiments and implementations are possible. Accordingly, the embodiments described herein are examples, not the only possible embodiments and implementations.

The subject matter of the disclosure may also relate, among others, to the following aspects:

Aspect 1. A fault monitoring device comprising:
  a primary resistance circuit configured to connect to a high-side voltage rail and a low-side voltage rail of a high voltage bus of a power system;
  a secondary resistance circuit configured to selectively connect to at least one of the high-side voltage rail or the low-side voltage rail via a switching circuit; and
  a controller configured to:
  selectively connect the secondary resistance circuit to the high-side voltage rail and the low-side voltage rail over a plurality of stages;
  in response to the selective connection, measure a plurality of sets of voltages over the plurality of stages; and
  determine a plurality of pairs of resistance values for a high-side insulation resistance and a low-side insulation resistance of the power system, each pair of resistance values based on a current set of measured voltages of a current stage of the plurality of stages and a prior set of measured voltages for a prior stage of the plurality of stages.

Aspect 2. The fault monitoring device of aspect 1, wherein the controller is further configured to:
  determine a plurality of pairs of parallel resistance values over the plurality of stages, each pair of parallel resistance values for: a high-side parallel resistance connection of a high-side resistance of the primary resistance circuit and the high-side insulation resistance and a low-side parallel resistance connection of a low-side resistance of the primary resistance circuit and the low-side insulation resistance; and
  determine the plurality of pairs of insulation resistance values based on the plurality of pairs of parallel resistance values.

Aspect 3. The fault monitoring device of aspects 1 or 2, wherein each of the plurality of stages corresponds to one of at least two different states of the secondary resistance circuit.

Aspect 4. The fault monitoring device of aspect 3, wherein the at least two different states comprises only two different states.

Aspect 5. The fault monitoring device of aspect 3, wherein the at least two different states comprises three or more different states.

Aspect 6. The fault monitoring device of any of aspects 3-5, wherein the controller is configured to selectively connect the secondary resistance circuit to the high-side voltage rail and the low-side voltage rail over a plurality of cycles, wherein for each cycle, each stage corresponds to a different one of the at least two different states.

Aspect 7. The fault monitoring device of aspect 6, wherein the controller is configured to selectively connect the secondary resistance circuit in each of the plurality of cycles according to a state sequence.

Aspect 8. The fault monitoring device of any of aspects 1-7, wherein the secondary resistance circuit comprises a high-side secondary resistance and a low-side secondary resistance, wherein the controller is further configured to:
  in a first stage of the plurality of stages, disconnect the high-side secondary resistance from the high-side voltage rail and the low-side secondary resistance from the low-side voltage rail;
  in a second stage of the plurality of stages, disconnect the high-side secondary resistance from the high-side voltage rail and connect the low-side secondary resistance to the low-side voltage rail;
  in a third stage of the plurality of stages, connect the high-side secondary resistance to the high-side voltage rail and the low-side secondary resistance to the low-side voltage rail; and
  in a fourth stage of the plurality of stages, connect the high-side secondary resistance to the high-side voltage rail and disconnect the low-side secondary resistance from the low-side voltage rail.

Aspect 9. The fault monitoring device of any of aspects 1-8, wherein the controller is further configured to:
  determine at least one sample resistance value associated with at least one pair of resistance values of the plurality of pairs of resistance values for the high-side insulation resistance and the low-side insulation resistance;
  compare the at least one sample resistance value with at least one threshold; and
  determine whether a fault is present in the power system based on the comparison.

Aspect 10. The fault monitoring device of aspect 9, wherein the at least one sample resistance value is, or is a function of, a difference between at least one high resistance value of the plurality of pairs of resistance values that is for the high-side insulation resistance and a least one low resistance value of the plurality of pairs of resistance values for the low-side insulation resistance.

Aspect 11. The fault monitoring device of aspect 9, wherein the at least one sample resistance value comprises a first sample resistance value comprising an average resistance value associated with the plurality of pairs of resistance values, and a second sample resistance value indicating a rate of change of resistance values associated with the plurality of pairs of resistance values.

Aspect 12. A power system comprising:
 a high voltage bus comprising:
  a high-side voltage rail insulated from a chassis by a high-side insulation resistance; and
  a low-side voltage rail insulated from the chassis by a low-side insulation resistance;
 a fault monitoring device connected to the high voltage bus, the fault monitoring device comprising a controller configured to:
  determine a pair of resistance values corresponding to the high-side insulation resistance and the low-side insulation resistance;
  determine whether a fault is present based on the pair of resistance values; and
  output, with an output device, a fault result indicating the determination of whether the fault is present.

Aspect 13. The power system of aspect 12, wherein the fault monitoring device further comprises a primary resistance circuit and a secondary resistance circuit, and wherein the controller is further configured to:
 selectively connect the secondary resistance circuit to the high-side voltage rail and the low-side voltage rail over a plurality of stages;
 in response to the selective connection, measure a plurality of sets of voltages over the plurality of stages; and
 determine the pair of resistance values for the high-side insulation resistance and the low-side insulation resistance in response to the selective connection.

Aspect 14. The power system of aspects 12 or 13, wherein the controller is configured to determine whether the fault is present by comparing a first resistance value of the pair of resistance values with a first threshold and comparing a second resistance value of the pair of resistance values with a second threshold within a single stage of a plurality of stages of a fault monitoring process.

Aspect 15. The power system of aspects 12 or 13, wherein the controller is configured to determine whether the fault is present by determining a difference between a first resistance value of the pair of resistance values and a second resistance value of the pair of resistance values.

Aspect 16. The power system of aspects 12 or 13, wherein the controller is further configured to:
 determine a plurality of sample resistance values corresponding to the pair of resistance values over a plurality of stages;
 determine at least one of: a moving average of the plurality of sample resistance values or a rate of change of the plurality of sample resistance values; and
 determine whether the fault is present based on at least one of: the moving average being below a first threshold or the rate of change being above a second threshold.

Aspect 17. The power system of any of aspects 12 to 16, wherein the controller is further configured to identify a location of the fault in the high voltage bus, the location being between the high-side voltage rail and the chassis or between the low-side voltage rail and the chassis.

Aspect 18. The power system of any of aspects 12-17, wherein the controller, is configured to output, with the output device, the fault result to indicate that the fault is a high-level rail fault determined for a first fault monitoring process, and to indicate that the fault is a mid-level rail fault determined for a second fault monitoring process.

Aspect 19. A method comprising:
 measuring, with a controller, a first pair of voltage levels across a primary resistance circuit of an insulation monitoring device in response to a secondary resistance circuit of the insulation monitoring device being in a first state;
 measuring, with the controller, a second pair of voltage levels across the primary resistance circuit in response to the secondary resistance circuit being in a second state different from the first state; and
 determining, with the controller, a pair of resistance values for a high-side insulation resistance and a low-side insulation resistance based on the first pair of voltage levels and the second pair of voltage levels.

Aspect 20. The method of aspect 19, wherein the pair of resistance values comprises a first pair of resistance values, the method further comprising:
 measuring, with the controller, a third pair of voltage levels across the primary resistance circuit in response to the secondary resistance circuit being in a third state different from the first state and the second state; and
 determining, with the controller, a second pair of resistance values for the high-side insulation resistance and the low-side insulation resistance based on the second pair of voltage levels and the third pair of voltage levels.

Aspect 21. A fault monitoring device comprising:
 a primary resistance circuit configured to connect to a high-side voltage rail and a low-side voltage rail of a high voltage bus of a power system;
 a secondary resistance circuit configured to selectively connect to at least one of the high-side voltage rail or the low-side voltage rail via a switching circuit; and
 a controller configured to:
  selectively connect the secondary resistance circuit to the high-side voltage rail and the low-side voltage rail over a plurality of stages;
  in response to the selective connection, determine a plurality of sample voltage levels corresponding to at least one of the high-side voltage rail or the low-side voltage rail for the plurality of stages, the plurality of sample voltage levels comprising at least one current sample voltage level for a current stage and at least one prior sample voltage level for a prior stage; and
  determine whether an internal fault is present in a voltage source connected to the high-side voltage rail and the low-side voltage rail based on the at least one current sample voltage level and the at least one prior sample voltage level.

Aspect 22. The fault monitoring device of aspect 21, wherein the controller is further configured to:
 determine that the internal fault is present in response to at least one amount of change between the at least one current sample voltage level and the at least one prior sample voltage level not exceeding at least one threshold; and
 determine that the internal fault is not present in response to the at least one amount of change exceeding the at least one threshold.

Aspect 23. The fault monitoring device of aspects 21 or 22, wherein the at least one current sample voltage level comprises a first current sample voltage level corresponding to the high-side voltage rail and a second current sample voltage level corresponding to the low-side voltage rail, and the at least one prior sample voltage level comprises a first prior sample voltage level corresponding to the high-side voltage rail and a second prior sample voltage level corresponding to the low-side voltage rail,
 wherein the controller, in order to determine whether the internal fault is present, is configured to at least one of: compare the first current sample voltage level and the first prior sample voltage level, or compare the second current sample voltage level and the second prior sample voltage level.

Aspect 24. The fault monitoring device of aspect 23, wherein the controller is configured to both: compare the first current sample voltage level and the first prior sample voltage level, and compare the second current sample voltage level and the second prior sample voltage level.

Aspect 25. The fault monitoring device of aspect 24, wherein the controller is further configured to:
determine whether a rail fault is present in the high voltage bus in response to the controller determining that no internal fault is present.

Aspect 26. The fault monitoring device of any of aspects 21-25, wherein the internal fault is between a location between two battery cells of the voltage source and a ground reference.

Aspect 27. The fault monitoring device of any of aspects 21-26, wherein each of the plurality of stages corresponds to one of at least two different states of the secondary resistance circuit.

Aspect 28. The fault monitoring device of any of aspects 21-27, wherein the controller is further configured to determine an internal fault location in response to determining that the internal fault is present.

Aspect 29. The fault monitoring device of aspect 28, wherein the controller configured to determine the internal fault location based on a first sample voltage level corresponding to the high-side voltage rail and a second sample voltage level corresponding to the low-side voltage rail.

Aspect 30. A power system comprising:
a high voltage bus comprising:
a high-side voltage rail;
a low-side voltage rail; and
a voltage source connected to the high-side voltage rail and the low-side voltage rail; and
a fault monitoring device connected to the high voltage bus, the fault monitoring device comprising a controller configured to:
determine whether an internal fault is present between an internal location of the voltage source and a chassis based on a current sample voltage level determined from a current stage of a fault monitoring process and a prior sample voltage level determined from a prior stage of the fault monitoring process; and
output, with an output device, a fault result indicating the determination of whether the internal fault is present.

Aspect 31. The power system of aspect 30, wherein each of the current sample voltage level and the prior sample voltage correspond to at least one of the high-side voltage rail or the low-side voltage rail.

Aspect 32. The power system of aspects 30 or 31, wherein the controller is further configured to:
determine that the internal fault is present in response to an amount of change between the current sample voltage level and the prior sample voltage level not exceeding a threshold.

Aspect 33. The power system of any of aspects 30-32, wherein the controller is further configured to:
determine that the internal fault is not present in response to an amount of change between the current sample voltage level and the prior sample voltage level exceeding a threshold.

Aspect 34. The power system of any of aspects 30-33, wherein the controller is further configured to:
determine whether a rail fault is present in the high voltage bus in response to the controller determining that no internal fault is present.

Aspect 35. The power system of aspect 34, wherein the controller is further configured to:

determine a pair of resistance values corresponding to a high-side insulation resistance and a low-side insulation resistance, the pair of resistance values based on the current sample voltage level and the prior sample voltage level; and
determine whether the rail fault is present based on the pair of resistance values.

Aspect 36. A fault detection method comprising:
switching, with a controller, a switching circuit into a first state in a first stage of a fault monitoring process;
determining, with the controller, a first sample voltage level corresponding to at least one of a high-side voltage rail or a low-side voltage rail with the switching circuit in the first state;
switching, with the controller, the switching circuit into a second state in a second stage of a fault monitoring process;
determining, with the controller, a second sample voltage level corresponding to the at least one of the high-side voltage rail or the low-side voltage rail with the switching circuit in the second state; and
detecting, with the controller, whether an internal fault is present in a voltage source connected to the high-side voltage rail and the low-side voltage rail based on the first sample voltage level and the second sample voltage level.

Aspect 37. The method of aspect 36, wherein detecting whether the internal fault is present comprises:
determining, with the controller, whether an amount of change between the first second sample voltage level and the second sample voltage level exceeds a threshold.

Aspect 38. The method of aspect 37, wherein detecting whether the internal fault is present further comprises:
determining, with the controller, that the internal fault is present in response to the amount of change not exceeding a threshold.

Aspect 39. The method of any of aspects 36-38, further comprising:
determining, with the controller, whether a rail fault is present in response to detecting that no internal fault is present.

Aspect 40. The method of any of aspects 36-39, wherein the internal fault is between a location between two battery cells of the voltage source and a ground reference of the high-side voltage rail and the low-side voltage rail.

In addition to the features mentioned in each of the independent aspects enumerated above, some examples may show, alone or in combination, the optional features mentioned in the dependent aspects and/or as disclosed in the description above and shown in the figures.

What is claimed is:

1. A fault monitoring device comprising:
a primary resistance circuit configured to connect to a high-side voltage rail and a low-side voltage rail of a high voltage bus of a power system;
a secondary resistance circuit configured to selectively connect to at least one of the high-side voltage rail or the low-side voltage rail via a switching circuit; and
a controller configured to:
selectively connect the secondary resistance circuit to the high-side voltage rail and the low-side voltage rail over a plurality of stages;
in response to the selective connection, measure a plurality of sets of voltages over the plurality of stages; and
determine a plurality of pairs of resistance values for a high-side insulation resistance and a low-side insulation resistance of the power system, each pair of resistance values comprises a respective first resistance value of the high-side insulation resistance and a respective second resistance value of the low-side insulation resistance, and each pair of resistance values based on a current set of measured voltages of a current stage of the plurality of stages and a prior set of measured voltages for a prior stage of the plurality of stages.

2. The fault monitoring device of claim 1, wherein the controller is further configured to:
determine a plurality of pairs of parallel resistance values over the plurality of stages, each pair of parallel resistance values for: a high-side parallel resistance connection of a high-side resistance of the primary resistance circuit and the high-side insulation resistance and a low-side parallel resistance connection of a low-side resistance of the primary resistance circuit and the low-side insulation resistance; and
determine the plurality of pairs of insulation resistance values based on the plurality of pairs of parallel resistance values.

3. The fault monitoring device of claim 1, wherein each of the plurality of stages corresponds to one of at least two different states of the secondary resistance circuit.

4. The fault monitoring device of claim 3, wherein the at least two different states comprises only two different states.

5. The fault monitoring device of claim 3, wherein the at least two different states comprises three or more different states.

6. The fault monitoring device of claim 3, wherein the controller is configured to selectively connect the secondary resistance circuit to the high-side voltage rail and the low-side voltage rail over a plurality of cycles, wherein for each cycle, each stage corresponds to a different one of the at least two different states.

7. The fault monitoring device of claim 6, wherein the controller is configured to selectively connect the secondary resistance circuit in each of the plurality of cycles according to a state sequence.

8. The fault monitoring device of claim 1, wherein the secondary resistance circuit comprises a high-side secondary resistance and a low-side secondary resistance, wherein the controller is further configured to:
in a first stage of the plurality of stages, disconnect the high-side secondary resistance from the high-side voltage rail and the low-side secondary resistance from the low-side voltage rail;
in a second stage of the plurality of stages, disconnect the high-side secondary resistance from the high-side voltage rail and connect the low-side secondary resistance to the low-side voltage rail;
in a third stage of the plurality of stages, connect the high-side secondary resistance to the high-side voltage rail and the low-side secondary resistance to the low-side voltage rail; and
in a fourth stage of the plurality of stages, connect the high-side secondary resistance to the high-side voltage rail and disconnect the low-side secondary resistance from the low-side voltage rail.

9. The fault monitoring device of claim 1, wherein the controller is further configured to:
determine at least one sample resistance value associated with at least one pair of resistance values of the plurality of pairs of resistance values for the high-side insulation resistance and the low-side insulation resistance;
compare the at least one sample resistance value with at least one threshold; and
determine whether a fault is present in the power system based on the comparison.

10. The fault monitoring device of claim 9, wherein the at least one sample resistance value is, or is a function of, a difference between at least one high resistance value of the plurality of pairs of resistance values that is for the high-side insulation resistance and a least one low resistance value of the plurality of pairs of resistance values for the low-side insulation resistance.

11. The fault monitoring device of claim 9, wherein the at least one sample resistance value comprises a first sample resistance value comprising an average resistance value associated with the plurality of pairs of resistance values, and a second sample resistance value indicating a rate of change of resistance values associated with the plurality of pairs of resistance values.

12. A power system comprising:
a high voltage bus comprising:
a high-side voltage rail insulated from a chassis by a high-side insulation resistance; and
a low-side voltage rail insulated from the chassis by a low-side insulation resistance;
a fault monitoring device connected to the high voltage bus, the fault monitoring device comprising a controller configured to:
determine a pair of resistance values corresponding to the high-side insulation resistance and the low-side insulation resistance, the pair of resistance values comprising a first resistance value of the high-side insulation resistance and a second resistance value of the low-side insulation resistance;
determine whether a fault is present based on the pair of resistance values; and
output, with an output device, a fault result indicating the determination of whether the fault is present.

13. The power system of claim 12, wherein the fault monitoring device further comprises a primary resistance circuit and a secondary resistance circuit, and wherein the controller is further configured to:
selectively connect the secondary resistance circuit to the high-side voltage rail and the low-side voltage rail over a plurality of stages;
in response to the selective connection, measure a plurality of sets of voltages over the plurality of stages; and
determine the pair of resistance values for the high-side insulation resistance and the low-side insulation resistance in response to the selective connection.

14. The power system of claim 12, wherein the controller is configured to determine whether the fault is present by comparing a first resistance value of the pair of resistance values with a first threshold and comparing a second resistance value of the pair of resistance values with a second threshold within a single stage of a plurality of stages of a fault monitoring process.

15. The power system of claim 12, wherein the controller is configured to determine whether the fault is present by determining a difference between a first resistance value of the pair of resistance values and a second resistance value of the pair of resistance values.

16. The power system of claim 12, wherein the controller is further configured to:
determine a plurality of sample resistance values corresponding to the pair of resistance values over a plurality of stages;
determine at least one of: a moving average of the plurality of sample resistance values or a rate of change of the plurality of sample resistance values; and determine whether the fault is present based on at least one of: the moving average being below a first threshold or the rate of change being above a second threshold.

17. The power system of claim 12, wherein the controller is further configured to identify a location of the fault in the high voltage bus, the location being between the high-side voltage rail and the chassis or between the low-side voltage rail and the chassis.

18. The power system of claim 12, wherein the controller, is configured to output, with the output device, the fault result to indicate that the fault is a high-level rail fault determined for a first fault monitoring process, and to indicate that the fault is a mid-level rail fault determined for a second fault monitoring process.

19. A method comprising:
   measuring, with a controller, a first pair of voltage levels across a primary resistance circuit of an insulation monitoring device in response to a secondary resistance circuit of the insulation monitoring device being in a first state;
   measuring, with the controller, a second pair of voltage levels across the primary resistance circuit in response to the secondary resistance circuit being in a second state different from the first state; and
   determining, with the controller, a pair of resistance values for a high-side insulation resistance and a low-side insulation resistance based on the first pair of voltage levels and the second pair of voltage levels, the pair of resistance values comprising a first resistance value of the high-side insulation resistance and a second resistance value of the low-side insulation resistance.

20. The method of claim 19, wherein the pair of resistance values comprises a first pair of resistance values, the method further comprising:
   measuring, with the controller, a third pair of voltage levels across the primary resistance circuit in response to the secondary resistance circuit being in a third state different from the first state and the second state; and
   determining, with the controller, a second pair of resistance values for the high-side insulation resistance and the low-side insulation resistance based on the second pair of voltage levels and the third pair of voltage levels.

* * * * *